(12) United States Patent
Yoon

(10) Patent No.: US 12,527,207 B2
(45) Date of Patent: Jan. 13, 2026

(54) DISPLAY DEVICE AND METHOD FOR MANUFACTURING THE SAME

(71) Applicant: Samsung Display Co., LTD., Yongin-si (KR)

(72) Inventor: Hyung Guen Yoon, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 559 days.

(21) Appl. No.: 17/891,623

(22) Filed: Aug. 19, 2022

(65) Prior Publication Data

US 2023/0180512 A1 Jun. 8, 2023

(30) Foreign Application Priority Data

Dec. 7, 2021 (KR) ........................ 10-2021-0173947

(51) Int. Cl.
*H10K 59/80* (2023.01)
*H01L 23/00* (2006.01)
*H01L 25/16* (2023.01)
*H10H 20/01* (2025.01)
*H10H 20/851* (2025.01)
*H10H 20/854* (2025.01)
*H10H 20/855* (2025.01)
*H10K 59/122* (2023.01)

(Continued)

(52) U.S. Cl.
CPC ......... *H10K 59/873* (2023.02); *H01L 25/167* (2013.01); *H10H 20/854* (2025.01); *H10H 20/855* (2025.01); *H10K 59/38* (2023.02); *H10K 71/00* (2023.02); *H01L 24/24* (2013.01); *H01L 2224/24051* (2013.01); *H01L 2224/24147* (2013.01); *H10H 20/0362* (2025.01); *H10H 20/8515* (2025.01); *H10K 59/122* (2023.02); *H10K 59/879* (2023.02)

(58) Field of Classification Search
None
See application file for complete search history.

(56) References Cited

U.S. PATENT DOCUMENTS 11,195,884 B2 12/2021 Kim et al.
11,818,937 B2 11/2023 Kim et al.
12,268,075 B2 4/2025 Seong et al.
(Continued)

FOREIGN PATENT DOCUMENTS

CN 112513724 A * 3/2021 ......... H01L 25/0753
JP 2005-5166 1/2005
(Continued)

*Primary Examiner* — Michael Lebentritt
(74) *Attorney, Agent, or Firm* — Womble Bond Dickinson (US) LLP

(57) ABSTRACT

A display device includes a first display substrate including a light emitting element layer, a second display substrate facing the first display substrate and including a light blocking member and a color conversion layer, a coupling member that connects the first display substrate and the second display substrate to each other, and a filling member disposed between the first display substrate and the second display substrate. The filling member includes a photoinitiator that initiates by absorbing light of a wavelength band in a range of about 380 nm to about 500 nm, and the light blocking member and the color conversion layer cover a side of an entire surface of the second display substrate.

20 Claims, 15 Drawing Sheets

(51) Int. Cl.
*H10K 59/38* (2023.01)
*H10K 71/00* (2023.01)

(56) References Cited

U.S. PATENT DOCUMENTS

2019/0006627 A1    1/2019  Li et al.
2019/0372056 A1*  12/2019  Lee ..................... H10K 50/858
2019/0386246 A1*  12/2019  Ku ....................... C09D 183/08
2019/0386251 A1*  12/2019  Erickson .............. H10K 59/879

FOREIGN PATENT DOCUMENTS

| | | | |
|---|---|---|---|
| JP | 5609878 | | 10/2014 |
| KR | 20150051479 A | * | 5/2015 |
| KR | 10-2017-0026950 A | | 3/2017 |
| KR | 10-2020-0078559 A | | 7/2020 |
| KR | 10-2020-0083879 A | | 7/2020 |
| KR | 10-2020-0097373 A | | 8/2020 |
| KR | 10-2021-0004851 A | | 1/2021 |
| KR | 20240050882 A | * | 4/2024 |

* cited by examiner

DISPLAY DEVICE AND METHOD FOR MANUFACTURING THE SAME

CROSS-REFERENCE TO RELATED APPLICATION(S)

This application claims priority to and benefits of Korean Patent Application No. 10-2021-0173947 under 35 U.S.C. § 119, filed on Dec. 7, 2021, in the Korean Intellectual Property Office (KIPO), the entire contents of which are incorporated herein by reference.

BACKGROUND

1. Technical Field

The disclosure relates to a display device and a method for manufacturing the same.

2. Description of the Related Art

The importance of display devices has increased with the development of multimedia. Accordingly, various types of display devices such as an organic light emitting display (OLED) and a liquid crystal display (LCD) have been used.

Display devices are devices displaying images, and include display panels such as organic light emitting display panels or liquid crystal display panels. Among them, the light emitting display panel may include light emitting elements such as light emitting diodes (LEDs), and examples of such light emitting diodes include organic light emitting diodes (OLED) that use an organic material as a light emitting material, inorganic light emitting diodes that use an inorganic material as a light emitting material, and the like.

SUMMARY

Aspects of the disclosure provide a display device in which a filling member may be photo-cured to be readily cured, and a method for manufacturing the same.

However, aspects of the disclosure are not restricted to those set forth herein. The above and other aspects of the disclosure will become more apparent to one of ordinary skill in the art to which the disclosure pertains by referencing the detailed description of the disclosure given below.

According to an embodiment of the disclosure, a display device may include a first display substrate including a light emitting element layer, a second display substrate facing the first display substrate, the second display substrate including a light blocking member and a color conversion layer, a coupling member that connects the first display substrate and the second display substrate to each other, and a filling member disposed between the first display substrate and the second display substrate. The filling member may include a photoinitiator that initiates by absorbing light of a wavelength band in a range of about 380 nm to about 500 nm, and the light blocking member and the color conversion layer cover a side of an entire surface of the second display substrate.

In an embodiment, the filling member may further include an acrylate-based monomer and a crosslinking agent.

In an embodiment, the photoinitiator may include at least one selected from the group of diphenyl-(2,4,6-trimethyl-benzoyl)-phosphine oxide (TPO) (e.g., Lucirin™ or LTPO), bis-(4-methoxybenzoyl) diethyl germanium (e.g., Ivocerin™), camphorquinone (CQ), and 1-phenyl-1,2-propane-dione (PPD).

In an embodiment, the filling member may have a refractive index in a range of about 1.5 to about 1.7.

In an embodiment, the light emitting element layer may emit light of a wavelength band in a range of about 380 nm to about 500 nm.

In an embodiment, the light emitting element layer may emit white light, and the color conversion layer includes a color filter layer including a first color filter layer transmitting red light, a second color filter layer transmitting green light, and a third color filter layer transmitting blue light.

In an embodiment, the color conversion layer may include a wavelength conversion layer, a light transmitting layer, and a color filter layer, the wavelength conversion layer may include a first wavelength conversion pattern converting blue light emitted from the light emitting element layer into red light and a second wavelength conversion pattern converting the blue light emitted from the light emitting element layer into green light, the color filter layer may include a first color filter layer overlapping the first wavelength conversion pattern in a plan view and transmitting the red light and a second color filter layer overlapping the second wavelength conversion pattern in a plan view and transmitting the green light, the light transmitting layer may not overlap the wavelength conversion layer and the color filter layer, and the light transmitting layer transmits the blue light emitted from the light emitting element layer as it is.

In an embodiment, the color conversion layer may include a wavelength conversion layer, a light transmitting layer, and a color filter layer, the wavelength conversion layer may include a first wavelength conversion pattern converting blue light emitted from the light emitting element layer into red light and a second wavelength conversion pattern converting the blue light emitted from the light emitting element layer into green light, the color filter layer may include a first fourth color filter layer overlapping the first wavelength conversion pattern in a plan view and transmitting the red light and a second fourth color filter layer overlapping the second wavelength conversion pattern in a plan view and transmitting the green light, the light transmitting layer may not overlap the wavelength conversion layer and the color filter layer, and the light transmitting layer transmits the blue light emitted from the light emitting element layer as it is.

In an embodiment, the color conversion layer may include a wavelength conversion layer, a light transmitting layer, and a color filter layer, the wavelength conversion layer may include a first wavelength conversion pattern converting cyan light emitted from the light emitting element layer into red light and a second wavelength conversion pattern converting the cyan light emitted from the light emitting element layer into green light, the color filter layer may include a first color filter layer overlapping the first wavelength conversion pattern in a plan view and transmitting the red light, a second color filter layer overlapping the second wavelength conversion pattern in a plan view and transmitting the green light, and a third color filter layer transmitting blue light from the cyan light emitted from the light emitting element layer, the light transmitting layer may be disposed below the third color filter layer, and the light transmitting layer transmits the cyan light emitted from the light emitting element layer as it is.

In an embodiment, the color conversion layer may include a wavelength conversion layer, a light transmitting layer, and a color filter layer, the wavelength conversion layer may include a first wavelength conversion pattern converting cyan light emitted from the light emitting element layer into red light and a second wavelength conversion pattern converting the cyan light emitted from the light emitting element layer into green light, the color filter layer may include a first fourth color filter layer overlapping the first wavelength conversion pattern in a plan view and transmitting the red light and a second fourth color filter layer overlapping the second wavelength conversion pattern in a plan view and transmitting the green light, the light transmitting layer may not overlap the wavelength conversion layer and the color filter layer in a plan view, and the light transmitting layer transmits the cyan light emitted from the light emitting element layer as it is.

In an embodiment, the light emitting element layer may include an organic light emitting diode or an inorganic light emitting diode.

According to an embodiment of the disclosure, a method for manufacturing a display device may include preparing a first display substrate including a light emitting element layer, preparing a second display substrate including a light blocking member and a color conversion layer, disposing a coupling member and a filling member composition on the second display substrate, bonding the first display substrate and the second display substrate to each other, and turning on the light emitting element layer and curing the filling member composition using light emitted from the light emitting element layer to form a filling member.

In an embodiment, the filling member composition may include an acrylate-based monomer, a crosslinking agent, and a photoinitiator that initiates by absorbing light of a wavelength band in a range of about 380 nm to about 500 nm.

In an embodiment, the photoinitiator may include at least one selected from the group of diphenyl-(2,4,6-trimethyl-benzoyl)-phosphine oxide (TPO) (e.g., Lucirin™ or LTPO), bis-(4-methoxybenzoyl) diethyl germanium (e.g., Ivocerin™), camphorquinone (CQ), and 1-phenyl-1,2-propanedione (PPD).

In an embodiment, an amount of the acrylate-based monomer may be in a range of about 98 wt % to about 99.8 wt % of a total weight of the filling member composition, an amount of the crosslinking agent may be in a range of about 0.1 wt % to about 1 wt % of the total weight of the filling member composition, and an amount of the photoinitiator may be in a range of about 0.1 wt % to about 1 wt % of the total weight of the filling member composition.

In an embodiment, the filling member composition may have a viscosity in a range of about 1 cp to about 10 cp.

In an embodiment, the filling member may have a refractive index in a range of about 1.5 to about 1.7.

In an embodiment, the light emitting element layer may emit light of a single color of a wavelength band in a range of about 380 nm to about 500 nm.

In an embodiment, the light emitting element layer may emit any one of white light, blue light, and cyan light.

In an embodiment, the method may further include curing the coupling member by irradiating a separate light to the coupling member.

With the display device and the method for manufacturing the same according to embodiments, the filling member including the photoinitiator absorbing the light of the wavelength band in a range of about 380 nm to about 500 nm may be formed, and may be cured with light emitted from the light emitting element layer in the display device. Accordingly, there is no restriction on equipment or a process at the time of curing the filling member, and a reliability issue of the light emitting element that may occur at the time of photo-curing the filling member may be prevented.

The effects of the disclosure are not limited to the aforementioned effects, and various other effects are included in the specification.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

It is to be understood that when a layer is referred to as being "on" another layer or substrate, it can be directly on the other layer or substrate, or intervening layers may also be present. The same reference numbers indicate the same components throughout the specification.

It is to be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, a second element could also be termed a first element.

In the specification and the claims, the phrase "at least one of" is intended to include the meaning of "at least one selected from the group of" for the purpose of its meaning and interpretation. For example, "at least one of A and B" may be understood to mean "A, B, or A and B."

Each of the features of the various embodiments of the disclosure may be combined with each other, in part or in whole, and various technical integration and driving may be possible. Each embodiment may be implemented independently or may be implemented together in an association.

Hereinafter, embodiments will be described with reference to the accompanying drawings.

Figure 1:
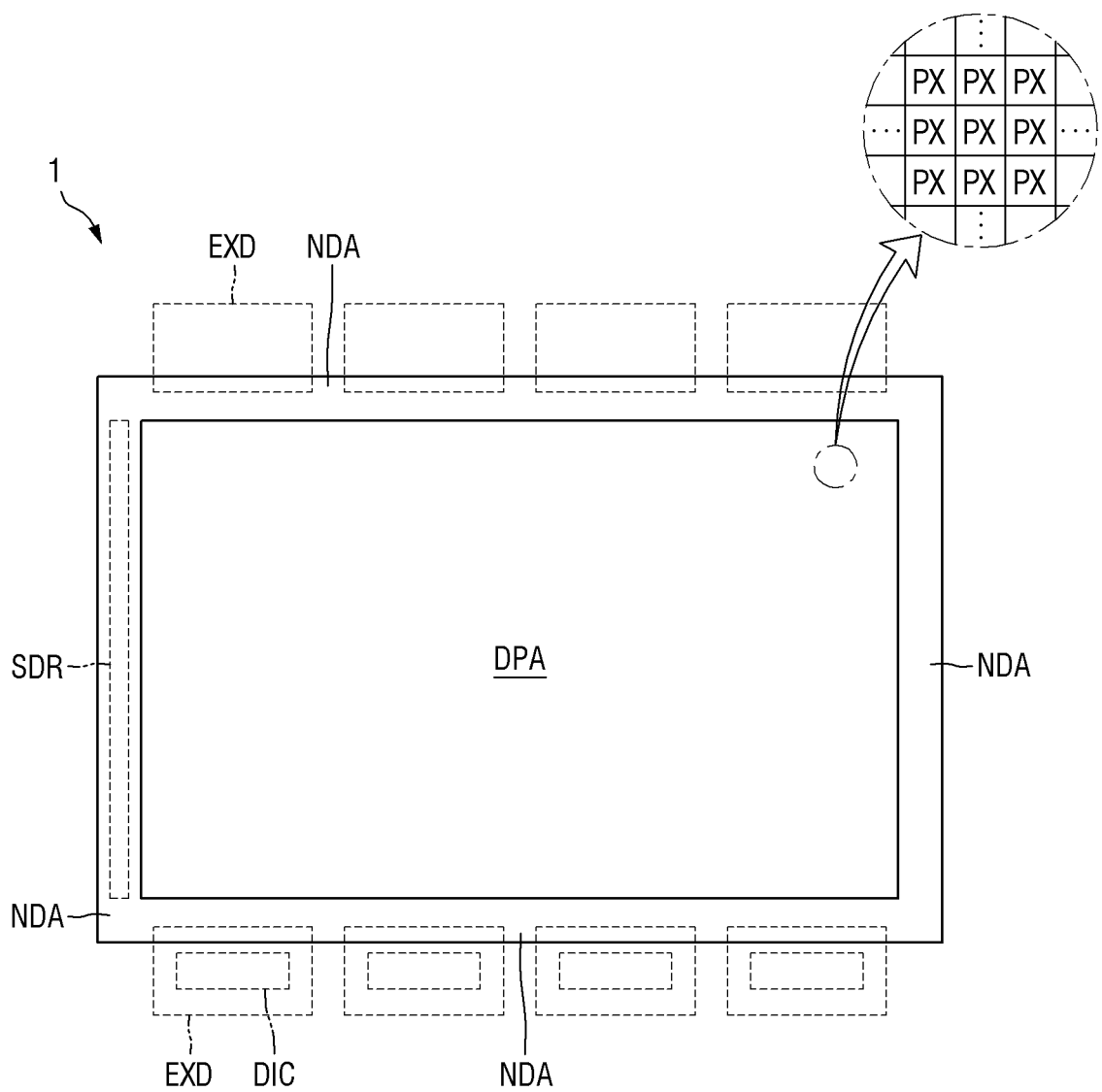
FIG. 1 is a plan view of a display device according to an embodiment.

FIG. 1 is a plan view of a display device according to an embodiment.

Referring to FIG. 1, a display device 1 according to an embodiment may be applied to smartphones, mobile phones, tablet personal computers (PCs), personal digital assistants (PDAs), portable multimedia players (PMPs), televisions, game machines, wrist watch-type electronic devices, head-mounted displays, monitors of personal computers, laptop computers, vehicle navigation systems, vehicle instrument boards, digital cameras, camcorders, external billboards, electric signs, medical devices, inspection devices, various home appliances such as refrigerators and washing machines, or Internet of Things (IoT) devices. In the specification, a television (TV) will be described as an example of the display device, and the TV may have high resolution or ultra-high resolution such as high definition (HD), ultra-high definition (UHD), 4K, or 8K.

The display device 1 according to an embodiment may be variously classified according to a display method. For example, classification of the display device may include an organic light emitting display (OLED), an inorganic light emitting display (inorganic EL), a quantum dot light emitting display (QED), a micro LED display (micro-LED), a nano LED display (nano-LED), a plasma display panel (PDP), a field emission display (FED), a cathode ray tube display (CRT), a liquid crystal display (LCD), an electrophoretic display (EPD), and the like. Hereinafter, an organic light emitting display and an inorganic light emitting display will be described as examples of the display device, and unless a special distinction is required, display devices applied to an embodiment will be simply abbreviated as a display device. However, an embodiment is not limited to the organic light emitting display or the inorganic light emitting display, and other display devices listed or not listed above may be applied within the scope of the disclosure.

The display device 1 according to an embodiment may have a quadrate shape in a plan view, for example, a rectangular shape. In case that the display device 1 is a television, the display device 1 may be arranged so that long sides thereof are positioned in a horizontal direction. However, the disclosure is not limited thereto, and the long sides of the display device 1 may be positioned in a vertical direction or the display device 1 may be rotatably installed, such that the long sides of the display device 1 may be variably positioned in the horizontal or vertical direction.

The display device 1 may include a display area DPA and non-display areas NDA. The display area DPA may be an active area in which an image is displayed. The display area DPA may have a rectangular shape in a plan view, similar to the overall shape of the display device 1, but is not limited thereto.

The display area DPA may include multiple pixels PX. The multiple pixels PX may be arranged in a matrix direction. A shape of each pixel PX may be a rectangular shape or a square shape in a plan view, but is not limited thereto, and may also be a rhombic shape of which each side is inclined with respect to one side direction of the display device 1. The multiple pixels PX may include several color pixels PX. For example, the multiple pixels PX may include a first color pixel PX of red, a second color pixel PX of green, and a third color pixel PX of blue, but are not limited thereto. The respective color pixels PX may be alternately arranged in a stripe type or a PENTILE™ type.

The non-display areas NDA may be disposed around the display area DPA. The non-display areas NDA may entirely or partially surround the display area DPA. The display area DPA may have a rectangular shape, and the non-display areas NDA may be disposed adjacent to four sides of the display area DPA. The non-display areas NDA may constitute a bezel of the display device 1.

A driving circuit or a driving element for driving the display area DPA may be disposed in the non-display areas NDA. In an embodiment, a pad part may be provided on a display substrate of the display device 1 in a first non-display area NDA disposed adjacent to a first long side (lower side in FIG. 1) of the display device 1 and a second non-display area NDA disposed adjacent to a second long side (upper side in FIG. 1) of the display device 1, and external devices EXD may be mounted on pad electrodes of the pad part. Examples of the external devices EXD may include a connection film, a printed circuit board, a driving chip (DIC), a connector, a wiring connection film, and the like. A scan driver SDR and the like formed directly on the display substrate of the display device 1 may be disposed in a third non-display area NDA disposed adjacent to a first short side (left side in FIG. 1) of the display device 1.

Figure 2:
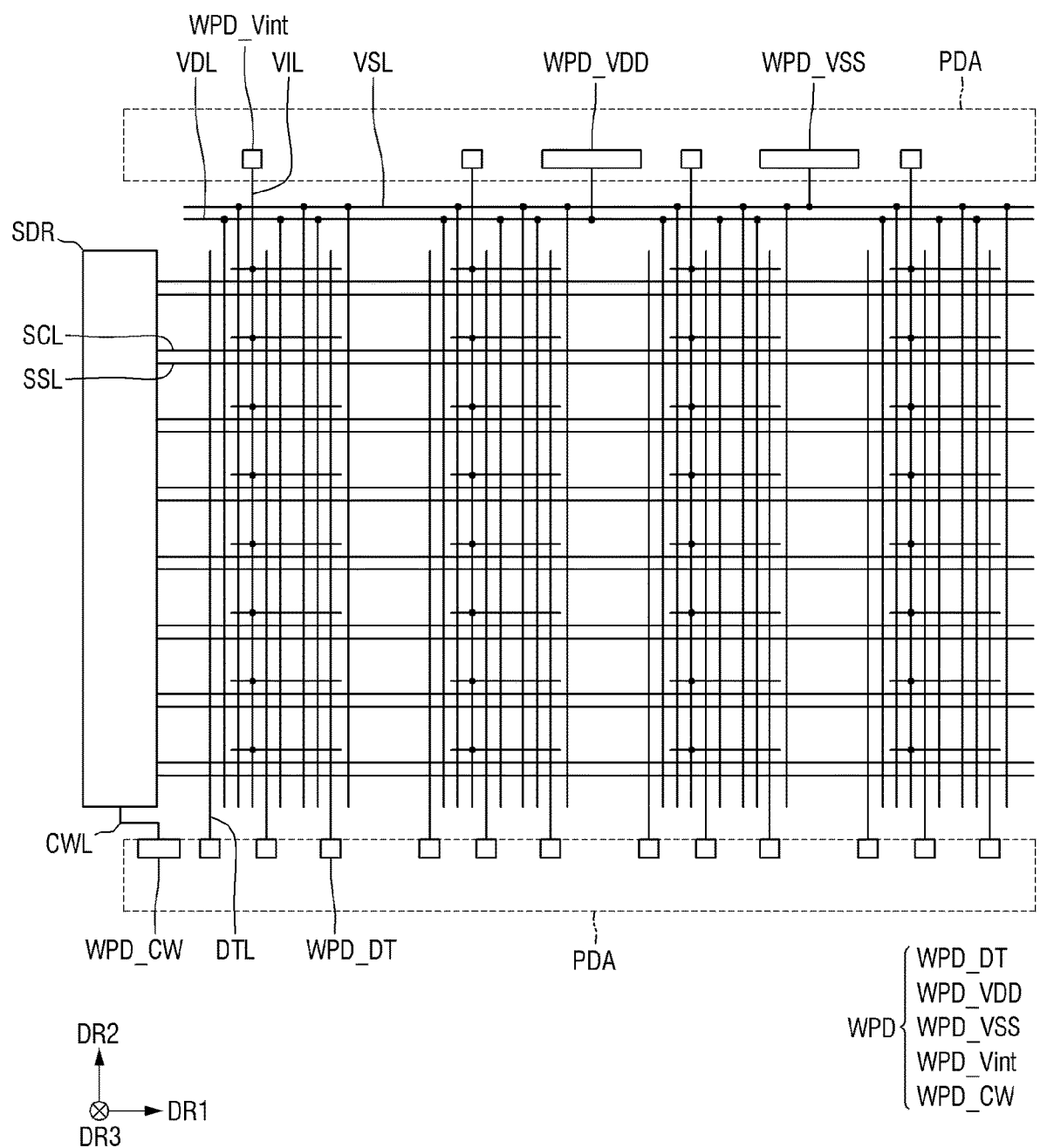
FIG. 2 is a schematic layout view illustrating lines included in a display device according to an embodiment.

FIG. 2 is a schematic layout view illustrating lines included in a display device according to an embodiment.

Referring to FIG. 2, the display device 1 may include multiple lines. The multiple lines may include scan lines SCL, sensing lines SSL, data lines DTL, initialization voltage lines VIL, first voltage lines VDL, and second voltage lines VSL. Although not illustrated in FIG. 3, other lines may be further disposed in the display device 1.

The scan lines SCL and the sensing lines SSL may extend in a first direction DR1. The scan lines SCL and the sensing lines SSL may be electrically connected to a scan driver SDR. The scan driver SDR may include a driving circuit. The scan driver SDR may be disposed on a side of the display area DPA in the first direction DR1, but is not limited thereto. The scan driver SDR may be electrically connected to a signal connection line CWL, and at least one end of the signal connection line CWL may be electrically connected to an external device by forming a pad WPD_CW on the non-display area NDA.

The term 'connection' used herein may not only mean that a member is connected to another member through a physical contact, but may also mean that a member is connected to another member through an intervening member. It may be also understood that an integrated member with a portion and another portion is interconnected due to the integrated member. Furthermore, a connection between a member and another member may include an electrical connection through an intervening member in addition to a direct contact.

Also, when an element is referred to as being "in contact" or "contacted" or the like to another element, the element may be in "electrical contact" or in "physical contact" with another element; or in "indirect contact" or in "direct contact" with another element.

The data lines DTL and the initialization voltage lines VIL may extend in a second direction DR2 crossing the first direction DR1. The initialization voltage lines VIL may further include portions branched from the portions in the first direction DR1. The first voltage lines VDL and the second voltage lines VSL may also include portions extending in the second direction DR2 and portions electrically connected to these portions and extending in the first direction DR1. The first voltage lines VDL and the second voltage lines VSL may have a mesh structure, but are not limited thereto. Although not illustrated in FIG. 2, each of the pixels PX of the display device 1 may be electrically connected to at least one data line DTL, initialization voltage line VIL, first voltage line VDL, and second voltage line VSL.

The data line DTL, the initialization voltage line VIL, the first voltage line VDL, and the second voltage line VSL may be electrically connected to at least one wiring pad WPD. Each wiring pad WPD may be disposed in the non-display area NDA. In an embodiment, data pads WPD_DT of the data lines DTL may be disposed on a pad area PDA positioned on a side of the display area DPA in the second direction DR2, and initialization voltage pads WPD_Vint of the initialization voltage lines VIL, first power pads WPD_VDD of the first voltage lines VDL, and second power pads WPD_VSS of the second voltage lines VSL may be disposed in a pad area PDA positioned on another side of the display area DPA in the second direction DR2. As another example, all of the data pads WPD_DT, the initialization voltage pads WPD_Vint, the first power pad WPD_VDD, and the second power pad WPD_VSS may be disposed in the same area, for example, a non-display area NDA positioned on an upper side of the display area DPA. An external device EXD may be mounted on the wiring pad WPD. An external device EXD may be mounted on the wiring pad WPD through an anisotropic conductive film, ultrasonic bonding, or the like.

Each pixel PX or sub-pixel SPXn (shown in FIG. 3, n is an integer of 1 to 3) of the display device 1 may include a pixel driving circuit. The above-described lines may send driving signals to the respective pixel driving circuits while passing through the respective pixels PX or around the respective pixels PX. The pixel driving circuit may include a transistor and a capacitor. The numbers of transistors and capacitors in each pixel driving circuit may be variously modified. According to an embodiment, each sub-pixel SPXn of the display device 1 may have a 3T1C structure in which the pixel driving circuit includes three transistors and one capacitor. Hereinafter, the pixel driving circuit will be described using the 3T1C structure as an example, but the disclosure is not limited thereto, and various other modified pixel PX structures such as a 2T1C structure, a 7T1C structure, or a 6T1C structure may also be applied.

Figure 3:
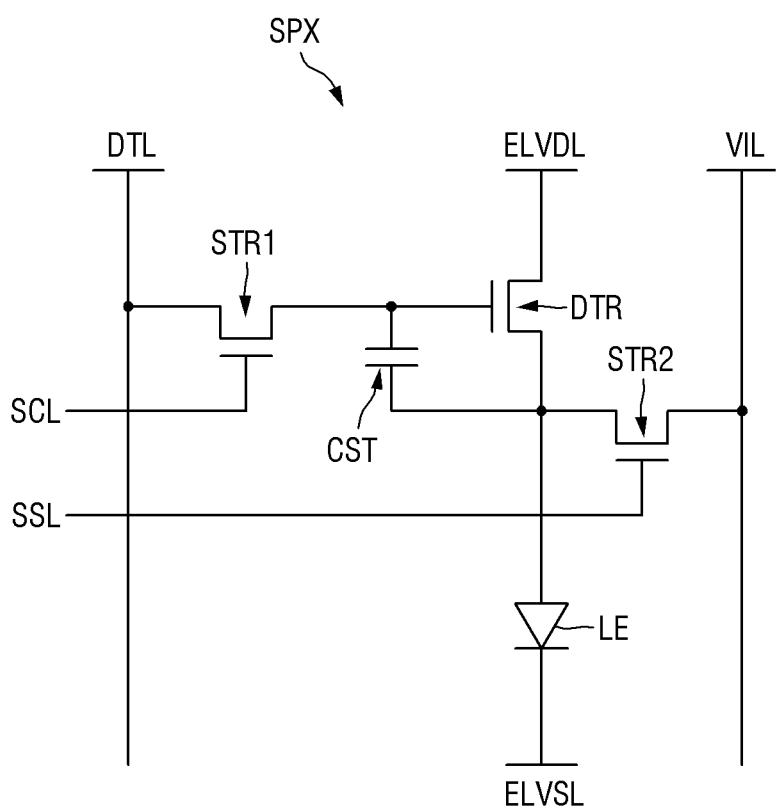
FIG. 3 is a schematic diagram of an equivalent circuit of a sub-pixel according to an embodiment.

FIG. 3 is a schematic diagram of an equivalent circuit of a sub-pixel according to an embodiment.

Referring to FIG. 3, each sub-pixel SPX of the display device 1 according to an embodiment may include three transistors DTR, STR1 and STR2 and one storage capacitor CST, in addition to a light emitting element LE.

The light emitting element LE may emit light in response to a current supplied through a driving transistor DTR. The light emitting element LE may be implemented as an inorganic light emitting diode, an organic light emitting diode, a micro light emitting diode, a nano light emitting diode, or the like.

A first electrode (i.e., an anode electrode) of the light emitting element LE may be electrically connected to a source electrode of the driving transistor DTR, and a second electrode (i.e., a cathode electrode) of the light emitting element LE may be electrically connected to a second power line ELVSL to which a low potential voltage (second source voltage) lower than a high potential voltage (first source voltage) of a first power line ELVDL is supplied.

The driving transistor DTR may adjust a current flowing from the first power line ELVDL to which the first source voltage is supplied to the light emitting element LE according to a voltage difference between a gate electrode and the source electrode thereof. The gate electrode of the driving transistor DTR may be electrically connected to a first electrode of a first transistor STR1, the source electrode of the driving transistor DTR may be electrically connected to the first electrode of the light emitting element LE, and a drain electrode of the driving transistor DTR may be electrically connected to the first power line ELVDL to which the first source voltage is applied.

The first transistor STR1 may be turned on by a scan signal of a scan line SCL to electrically connect a data line DTL to the gate electrode of the driving transistor DTR. A gate electrode of the first transistor STR1 may be electrically connected to the scan line SCL, the first electrode of the first transistor STR1 may be electrically connected to the gate electrode of the driving transistor DTR, and a second electrode of the first transistor STR1 may be electrically connected to the data line DTL.

A second transistor STR2 may be turned on by a sensing signal of a sensing signal line SSL to electrically connect an initialization voltage line VIL to the source electrode of the driving transistor DTR. A gate electrode of the second transistor STR2 may be electrically connected to the sensing signal line SSL, a first electrode of the second transistor STR2 may be electrically connected to the initialization voltage line VIL, and a second electrode of the second transistor STR2 may be electrically connected to the source electrode of the driving transistor DTR.

In an embodiment, the first electrode of each of the first and second transistors STR1 and STR2 may be a source electrode, and the second electrode of each of the first and second transistors STR1 and STR2 may be a drain electrode, but the disclosure is not limited thereto.

The storage capacitor CST may be formed between the gate electrode and the source electrode of the driving transistor DTR. The storage capacitor CST may store a difference voltage between a gate voltage and a source voltage of the driving transistor DTR.

The driving transistor DTR and the first and second transistors STR1 and STR2 may be formed as thin film transistors. The driving transistor DTR and the first and second transistors STR1 and STR2 may be N-type metal oxide semiconductor field effect transistors (MOSFETs), but the disclosure is not limited thereto. For example, the driving transistor DTR and the first and second transistors STR1 and STR2 may be P-type MOSFETs or some of the driving transistor DTR and the first and second transistors STR1 and STR2 may be N-type MOSFETs and the rest of the driving transistor DTR and the first and second transistors STR1 and STR2 may be P-type MOSFETs.

Figure 4:
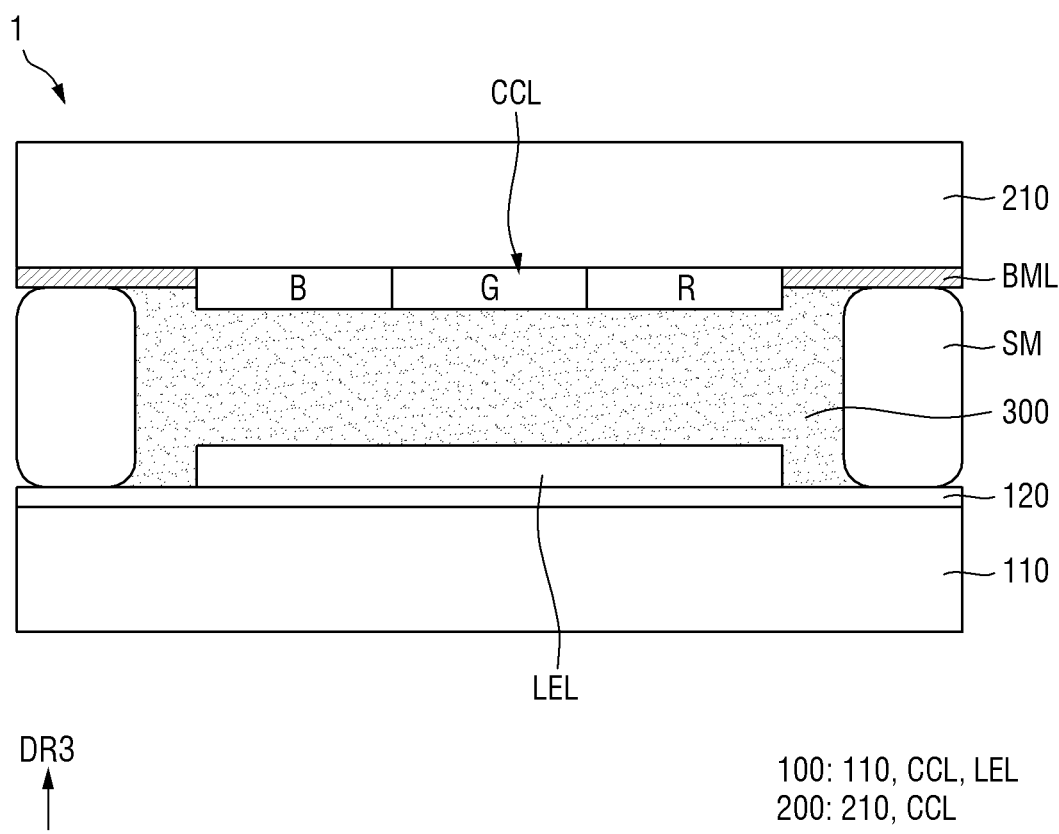
FIG. 4 is a schematic cross-sectional view illustrating the display device according to an embodiment.

FIG. 4 is a schematic cross-sectional view illustrating the display device according to an embodiment.

Referring to FIG. 4, a display device 1 according to an embodiment may include a first display substrate 100, a second display substrate 200 facing the first display substrate 100, a coupling member SM adhering the first display substrate 100 and the second display substrate 200 to each other, and a filling member 300 filled between the first display substrate 100 and the second display substrate 200.

The first display substrate 100 may include a first substrate 110, a circuit layer 120, and a light emitting element layer LEL. The first substrate 110 may be an insulating substrate. The first substrate 110 may include a transparent material. For example, the first substrate 110 may include a transparent insulating material such as glass or quartz. The first substrate 110 may be a rigid substrate. However, the first substrate 110 is not limited thereto, and may include plastic such as polyimide, and may have flexible characteristics to be bent, folded, or rolled.

The circuit layer 120 may drive each sub-pixel, and may be disposed on the first substrate 110. The circuit layer 120 may be disposed between the first substrate 110 and the light emitting element layer LEL. The light emitting element layer LEL may be disposed on the circuit layer 120.

The second display substrate 200 may include a second substrate 210, a light blocking member BML, and a color conversion layer CCL. The second substrate 210 may be the same as the above-described first substrate 110.

The color conversion layer CCL may be disposed on a surface of the second substrate 210 facing the first substrate 110. The color conversion layer CCL may convert, transmit, or block a wavelength of light emitted from the light emitting element layer LEL to convert the light into light of a desired wavelength band. The color conversion layer CCL may include a color filter and/or a wavelength conversion member including quantum dots.

The light blocking member BML may be disposed between adjacent color conversion layers CCL corresponding to a boundary of each sub-pixel of the first substrate 110. The light blocking member BML may be disposed to partially correspond to the light emitting element layer LEL, and may be disposed in areas that do not overlap the light emitting element layer LEL in a plan view. One surface of the second substrate 210 facing the first substrate 110 may be entirely covered by the above-described color conversion layer CCL and light blocking member BML.

The coupling member SM may be disposed between the first substrate 110 and the second substrate 210. The coupling member SM may be disposed in the non-display area NDA (see FIG. 1) other than the display area DPA (see FIG. 1) from which light is emitted. The coupling member SM may be disposed to surround the display area, and may adhere and couple the first substrate 110 and the second substrate 210 to each other.

The filling member 300 may be disposed between the first display substrate 100 and the second display substrate 200. The filling member 300 may serve to fill a space between the first display substrate 100 and the second display substrate 200 and adhere and couple the first display substrate 100 and the second display substrate 200 to each other. The filling member 300 may minimize a difference of refractive index between the first display substrate 100 and the second display substrate 200 and may prevent permeation of moisture.

The above-described filling member 300 may be applied onto the first display substrate 100 or the second display substrate 200, may bond the first display substrate 100 and the second display substrate 200 to each other, and then be cured to be manufactured. The filling member 300 may include a resin, and in order to cure the resin, a heat-curing method or a photo-curing method may be considered. As a curing method of the filling member 300 using photo-curing among these methods, light may be irradiated from below the first display substrate 100 or may be irradiated from above the second display substrate 200. However, in case that the light is irradiated from below the first display substrate 100, it may be difficult for ultraviolet light (UV) to be transmitted through the first display substrate 100 due to many lines of the circuit layer 120, and in case that the light is irradiated from above the second display substrate 200, the light blocking member BML and the color conversion layer CCL may block the light, and as a result, it may be difficult to irradiate UV light from both directions. In a curing method of the filling member 300 using heat-curing, there may be a risk of damage to the light emitting element layer LEL due to heat, such that a temperature selection may be limited, and curing uniformity of the filling member 300 may be deteriorated in case that heat is not uniformly transferred to the filling member 300. Hereinafter, the display device 1 in which the filling member 300 may be photo-cured will be described.

Figure 5:
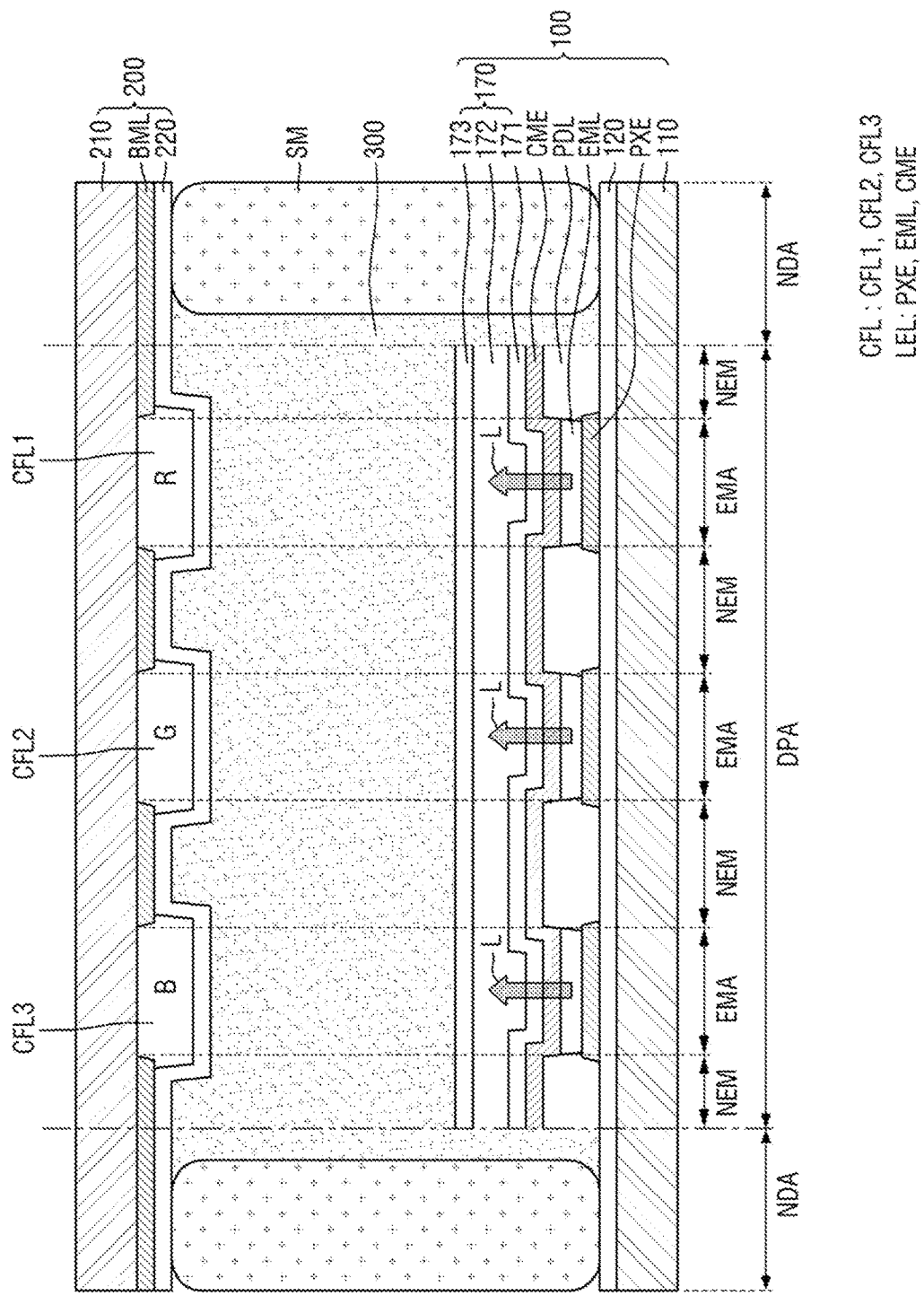
FIG. 5 is a schematic cross-sectional view illustrating the display device according to an embodiment.
Figure 6:
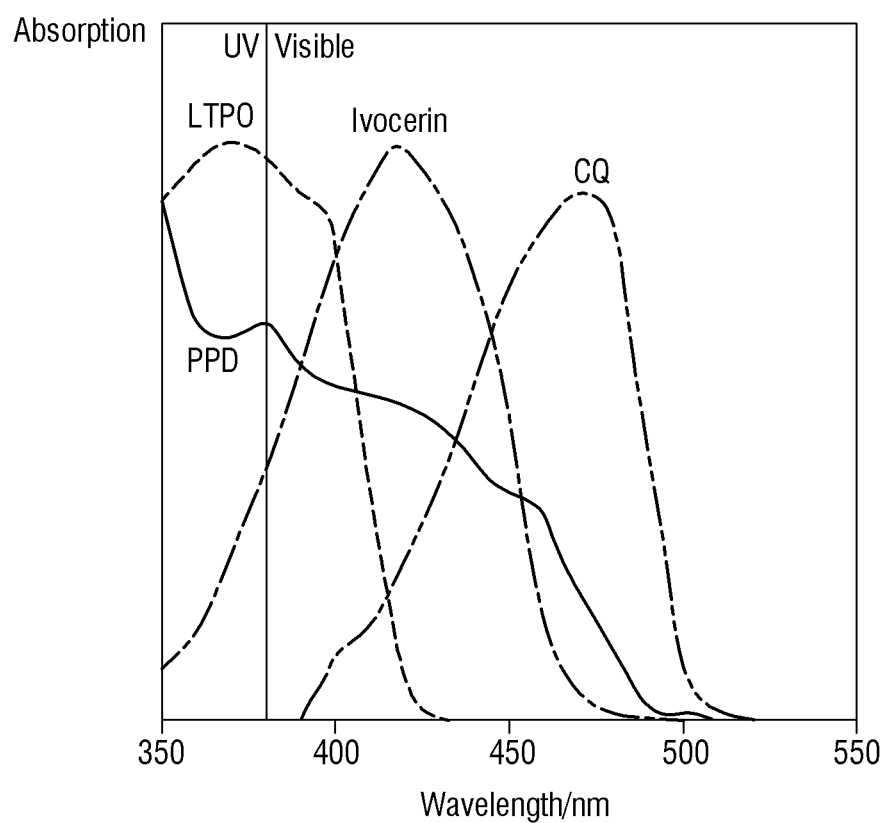
FIG. 6 is graphs showing absorptions for each wavelength band of photoinitiators.

FIG. 5 is a schematic cross-sectional view illustrating the display device according to an embodiment. FIG. 6 is graphs showing absorptions for each wavelength band of photoinitiators. FIG. 5 has illustrated an embodiment in which the light emitting element layer LEL includes an organic light emitting diode.

In FIG. 5, a top emission-type display device 1 is illustrated, in which light L is emitted in a direction from a first substrate 110, on which an emission layer EML is formed, to a second substrate 210. However, the disclosure is not limited thereto, and the display device 1 may be a bottom emission-type display device 1 in which light is emitted in a direction toward the first substrate 110 on which the emission layer EML is formed or a double-sided emission-type display device 1 in which light is emitted in both direction from the first substrate 110 and from the second substrate 210.

The display device 1 may include a first display substrate 100, a second display substrate 200 facing the first display substrate 100, a filling member 300, and a coupling member SM.

The first display substrate 100 may include a first substrate 110, a circuit layer 120, and a light emitting element layer LEL. The circuit layer 120 may be disposed over the display area DPA and the non-display area NDA, and the light emitting element layer LEL may be disposed in the display area DPA. The first substrate 110 and the circuit layer 120 have been described above, and a description thereof will thus be omitted.

The light emitting element layer LEL may be disposed on the circuit layer 120. The light emitting element layer LEL may include pixel electrodes PXE, emission layers EML, and a common electrode CME.

Multiple pixel electrodes PXE may be disposed for each sub-pixel. The pixel electrodes PXE of neighboring sub-pixels may be separated from each other. The pixel electrode PXE may be a first electrode, for example, an anode electrode, of a light emitting diode. The pixel electrode PXE may have a stacked film structure in which a material layer having a high work function, made of indium-tin-oxide (ITO), indium-zinc-oxide (IZO), zinc oxide (ZnO), or indium oxide ($In_2O_3$) and a reflective material layer made of silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca), or mixtures thereof are stacked each other. The material layer having a high work function may be disposed on the reflective material layer so that the material layer having a high work function may be disposed close to the emission layer EML. The pixel electrode PXE may have a multilayer structure such as ITO/Mg, ITO/MgF, ITO/Ag, or ITO/Ag/ITO, but is not limited thereto.

A pixel defining film PDL may be disposed on a surface of the first substrate 110 along boundaries of the sub-pixels. The pixel defining film PDL may be disposed on the pixel electrodes PXE and may include openings exposing the pixel electrodes PXE. Emission areas EMA and non-emission areas NEM may be divided according to the pixel defining film PDL and the openings of the pixel defining film PDL. The pixel defining film PDL may include an organic insulating material such as a polyacrylates resin, an epoxy resin, a phenolic resin, a polyamides resin, a polyimides resin, an unsaturated polyesters resin, a polyphenyleneethers resin, a polyphenylenesulfides resin, or benzocyclobutene (BCB). The pixel defining film PDL may also include an inorganic material.

The emission layers EML may be disposed on the pixel electrodes PXE in the area exposed by the pixel defining film PDL. In an embodiment in which the display device 1 is an organic light emitting display, the emission layer EML may include an organic layer including an organic material. The organic layer may include an organic light emitting layer, and may further include at least one of a hole injection layer, a hole transport layer, an electron transport layer, and an electron injection layer as auxiliary layers supporting light emission in an embodiment.

In embodiments, the emission layer EML may have a tandem structure including multiple organic light emitting layers disposed to overlap each other in a thickness direction and a charge generating layer disposed between the multiple organic light emitting layers. The respective organic light emitting layers disposed to overlap each other may emit light of the same wavelength or emit light of different wavelengths. At least some layers of the emission layer EML of each pixel PX may be separated from the same layer of a neighboring pixel PX.

In an embodiment, a wavelength of light emitted by each emission layer EML may be the same for each sub-pixel. For example, the emission layer EML of each color pixel PX may emit white light, and by a color control structure to be described later including a color conversion layer CCL, a color for each sub-pixel may be displayed. For example, the emission layer EML may emit white light by including organic emission layers that emit blue light and yellow light that are stacked each other.

The common electrode CME may be disposed on the emission layers EML. The common electrode CME may be not only in contact with the emission layers EML but also in contact with an upper surface of the pixel defining film PDL. The common electrode CME may be electrically connected to emission layers EML without distinction of each sub-pixel. The common electrode CME may be an electrode that is entirely disposed. The common electrode CME may be a second electrode, for example, a cathode electrode, of the light emitting diode, but is not limited thereto.

The common electrode CME may include a material layer having a low work function, such as Li, Ca, LiF/Ca, LiF/Al, Al, Mg, Ag, Pt, Pd, Ni, Au, Nd, Ir, Cr, BaF, Ba, or compounds or mixtures thereof (e.g., a mixture of Ag and Mg, etc.). The common electrode CME may further include a transparent metal oxide layer disposed on the material layer having a low work function.

The pixel electrodes PXE, the emission layers EML, and the common electrode CME may constitute the light emitting element layer LEL. Light emitted from the emission layer EML may be emitted in an upward direction through the common electrode CME.

A thin film encapsulation structure 170 may be disposed on the common electrode CME. The thin film encapsulation structure 170 may include at least one thin film encapsulation layer. For example, the thin film encapsulation layer may include a first inorganic film 171, an organic film 172, and a second inorganic film 173. Each of the first inorganic film 171 and the second inorganic film 173 may include silicon nitride ($SiN_x$), silicon oxide ($SiO_x$), silicon oxynitride ($SiO_xN_y$), or the like. The organic film 172 may include an organic insulating material such as a polyacrylates resin, an epoxy resin, a phenolic resin, a polyamides resin, a polyimides resin, an unsaturated polyesters resin, a polyphenyleneethers resin, a polyphenylenesulfides resin, or benzocyclobutene (BCB).

The second display substrate 200 may be disposed above the thin film encapsulation structure 170 so as to face the thin film encapsulation structure 170. The second display substrate 200 may include a second substrate 210 and a color conversion layer CCL. The second substrate 210 may include a transparent insulating material such as glass or quartz. The second substrate 210 may be a rigid substrate. However, the second substrate 210 is not limited thereto, and may include plastic such as polyimide and may have flexible characteristics to be bent, folded, or rolled.

The second substrate 210 may be the same substrate as the first substrate 110, or may be different in material, thickness, transmissivity, and the like, from the first substrate 110. For example, the second substrate 210 may have a higher transmissivity than the first substrate 110. The second substrate 210 may be thicker or thinner than the first substrate 110.

A light blocking member BML may be disposed along the boundaries of the sub-pixels on a surface of the second substrate 210 facing the first substrate 110. The light blocking member BML may overlap the pixel defining film PDL of the first display substrate 100 in a plan view, and may be positioned in the non-emission areas NEM. The light blocking member BML may include openings exposing a surface of the second substrate 210 overlapping the emission areas EMA. The light blocking member BML may be formed in a lattice shape in a plan view.

The light blocking member BML may include an organic material. The light blocking member BML may reduce distortion of colors due to external light reflection by absorbing external light. The light blocking member BML may serve to prevent light emitted from the emission layers EML of adjacent sub-pixels.

In an embodiment, the light blocking member BML may absorb all of visible light wavelengths. The light blocking member BML may include a light absorbing material. For example, the light blocking member BML may be made of a material used as a black matrix of the display device 1.

A color filter layer CFL may be disposed as a color conversion layer on the surface of the second substrate 210 on which the light blocking member BML is disposed. The color filter layer CFL may be disposed on the surface of the second substrate 210 exposed through the openings of the light blocking member BML. The color filter layer CFL may also be partially disposed on the light blocking member BML adjacent thereto. The color filter layer CFL may be disposed to overlap the display area DPA, and the light blocking member BML may be disposed over the display area DPA and the non-display area NDA.

The color filter layer CFL may include a first color filter layer CFL1, a second color filter layer CFL2, and a third color filter layer CFL3. Each color filter layer CFL may include a colorant such as a dye or a pigment absorbing a wavelength other than a corresponding color wavelength. The first color filter layer CFL1 may be a red color filter layer, the second color filter layer CFL2 may be a green color filter layer, and the third color filter layer CFL3 may be a blue color filter layer. It has been illustrated in FIG. 5 that neighboring color filter layers CFL are disposed to be spaced apart from each other due to the light blocking member BML, but the neighboring color filter layers CFL may also at least partially overlap each other on the light blocking member BML. The color filter layers CFL illustrated in FIG. 5 may emit each light such as red light, green light, and blue light through red, green, and blue color filter layers, respectively. However, the disclosure is not limited thereto, and the light emitting element layer LEL may further include a white light transmitting part from which the white light is emitted to emit four lights such as white light, red light, green light, and blue light.

The above-described light blocking member BML and color conversion layer CCL may entirely cover a surface of the second substrate 210. For example, the color conversion layer CCL may be disposed on a surface of the second substrate 210 corresponding to the light emitting element layer LEL of the first substrate 110, and the light blocking member BML may be disposed in areas of a surface of the second substrate 210 that does not overlap the light emitting element layer LEL. Since the light blocking member BML and the color conversion layer CCL cover a surface of the second substrate 210 corresponding to the first substrate 110, light irradiated from the outside may be blocked and absorbed by the light blocking member BML and the color conversion layer CCL. In an embodiment, as described later, the light may not be incident from the outside, and thus, the filling member 300 may be cured using the light emitted from the light emitting element layer LEL.

A first capping layer 220 may be disposed on the color filter layer CFL. The first capping layer 220 may prevent impurities such as moisture or air from permeating from the outside to damage or contaminate the color filter layer CFL. The first capping layer 220 may prevent the colorant of the color filter layer CFL from being diffused into other components.

The first capping layer 220 may be in contact with a surface of the color filter layer CFL. The first capping layer 220 may be made of an inorganic material. For example, the first capping layer 220 may include silicon nitride, aluminum nitride, zirconium nitride, titanium nitride, hafnium nitride, tantalum nitride, silicon oxide, aluminum oxide, titanium oxide, tin oxide, silicon oxynitride, or the like.

The coupling member SM may be disposed between the first display substrate 100 and the second display substrate 200. The coupling member SM may be disposed to overlap the non-display area NDA, and may adhere and connect the first display substrate 100 and the second display substrate 200 to each other. The coupling member SM may include a sealant including an organic material, a frit including an inorganic material, or the like, but is not limited thereto.

The filling member 300 may be disposed between the first display substrate 100 and the second display substrate 200. The filling member 300 may serve to fill a space between the first display substrate 100 and the second display substrate 200 and adhere and couple the first display substrate 100 and the second display substrate 200 to each other. The filling member 300 may be disposed over the display area DPA and the non-display area NDA. The filling member 300 may be disposed between the thin film encapsulation structure 170 of the first display substrate 100 and the first capping layer 220 of the second display substrate 200.

The filling member 300 may be formed by a process of applying a filling member composition to one surface of the first display substrate 100 or the second display substrate 200, aligning and bonding the first display substrate 100 and the second display substrate 200 with and to each other, and irradiating light to cure the filling member composition.

In an embodiment, the filling member 300 may include an acrylate-based monomer, a photoinitiator, and a crosslinking agent.

The acrylate-based monomer may include a material having a low viscosity to be readily coated and may have, for example, a viscosity of about 5 cp or less. The acrylate-based monomer may include at least one selected from the group of hydroxyethyl acrylate (HEA), hydroxyethyl methacrylate (HEMA), hexanediol diacrylate (HDDA), tripropylene glycol diacrylate (TPGDA), ethylene glycol diacrylate (EGDA), trimethylolpropane triacrylate (TMPTA), trimethylolpropaneethoxy triacrylate (TMPEOTA), propoxylated glycerol triacrylate (GPTA), pentaerythritol tetraacrylate (PETA), and dipentaerythritol hexaacrylate (DPHA). However, the disclosure is not limited thereto.

The photoinitiator may include a material capable of being initiated by absorbing light of a visible light wavelength band. In an embodiment, the filling member 300 may be cured using the light emitted from the light emitting element layer LEL. The photoinitiator may include a material capable of being initiated by absorbing light of a wavelength band of about 380 nm to about 500 nm corresponding to a wavelength band of the light emitted from the light emitting element layer LEL.

For example, the photoinitiator may include at least one selected from the group of diphenyl-(2,4,6-trimethylbenzoyl)-phosphine oxide (TPO) (e.g., Lucirin™ or LTPO), bis-(4-methoxybenzoyl) diethyl germanium (e.g., Ivocerin™), camphorquinone (CQ), and 1-phenyl-1,2-propanedione (PPD). However, the disclosure is not limited thereto.

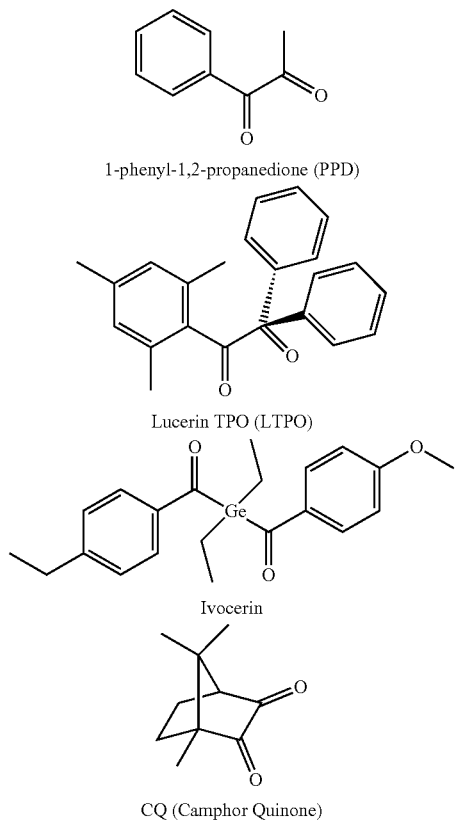

It has been illustrated in FIG. 6 that the above-described photoinitiators may be initiated by absorbing light of a wavelength band of about 380 nm to about 500 nm.

The crosslinking agent may serve to polymerize the acrylate-based monomer. The crosslinking agent may include, for example, at least one selected from the group of cyanuric chloride, trimesoyl chloride, terephthaloyl chloride, epichlorohydrin, dibromobenzene, glutalaldehyde, phenylenediisocyanate, tolylene diisocyanate, divinylsulfone, 1,1'-carbonyldiimidazole, and alkoxysilanes. However, the disclosure is not limited thereto.

An amount of the acrylate-based monomer included in the above-described filling member 300 may be in a range of about 98 wt % to about 99.8 wt % based on a total weight of the filling member composition, an amount of the photoinitiator included in the above-described filling member 300 may be in a range of about 0.1 wt % to about 1 wt % based on a total weight of the filling member composition, and an amount of the crosslinking agent included in the above-described filling member 300 may be in a range of about 0.1 wt % to about 1 wt % based on a total weight of the filling member composition.

In case that the acrylate-based monomer, the photoinitiator, and the crosslinking agent are mixed with each other within the content ranges described above, the filling member 300 may provide a viscosity required for a process and may have rigidity and an adhesive force enough to resist an external force. The filling member composition for manufacturing the filling member 300 may have a viscosity of about 1 cp to about 10 cp to be readily applied.

The filling member 300 may further include an additive. The additive may include, for example, an adhesion enhancer, an anti-yellowing agent, an antioxidant, and the like, but is not limited thereto.

The filling member 300 may have a refractive index of about 1 or more in order to minimize differences in refractive index at interfaces between the first display substrate 100 and the filling member 300 and between the filling member 300 and the second display substrate 200. In an embodiment, the refractive index of the filling member 300 may be about 1.5 to about 1.7.

The above-described filling member 300 may be photo-cured by irradiating light of a visible light wavelength band. In an embodiment, the filling member 300 may be cured using the light emitted from the light emitting element layer LEL of the first display substrate 100.

Figure 7:
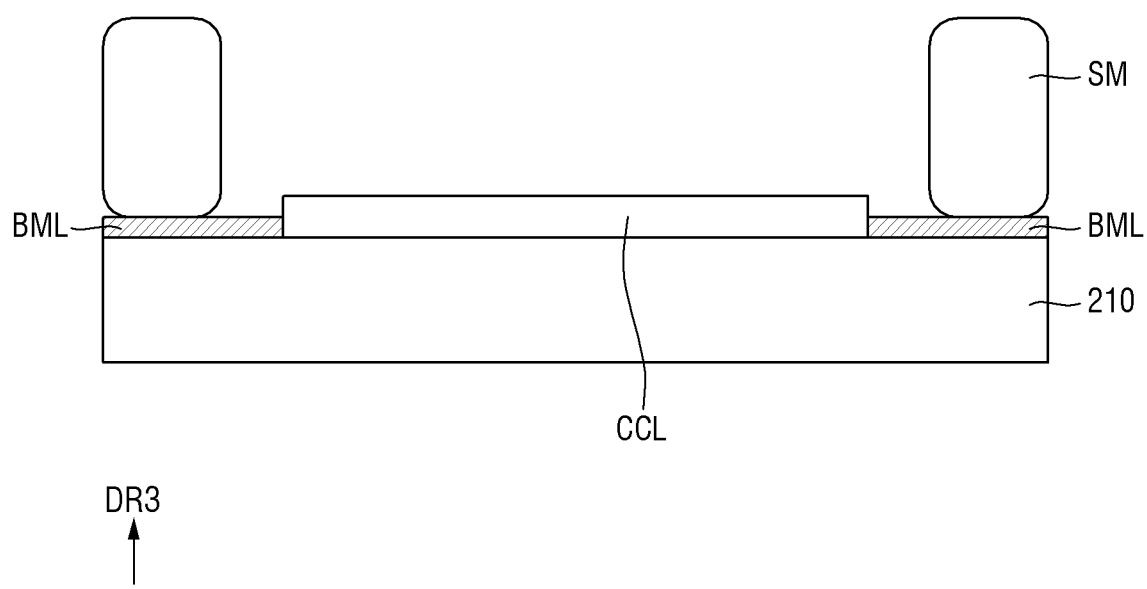
FIGS. 7 to 9 are schematic cross-sectional views illustrating processes of a method for manufacturing a display device according to an embodiment.
Figure 8:
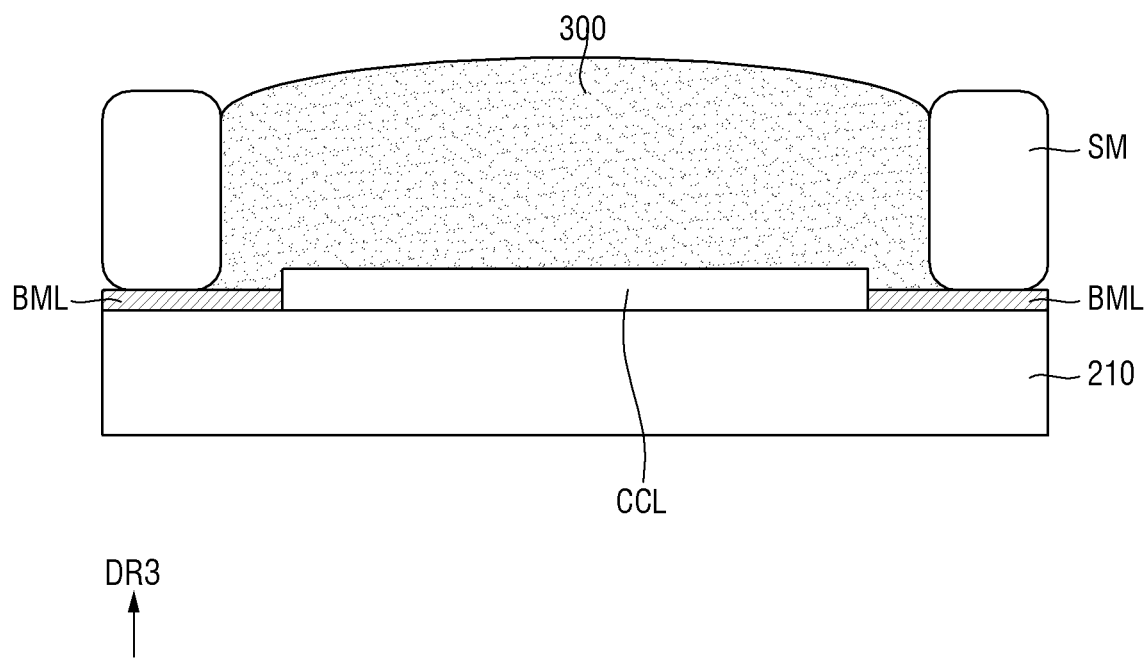
Figure 9:
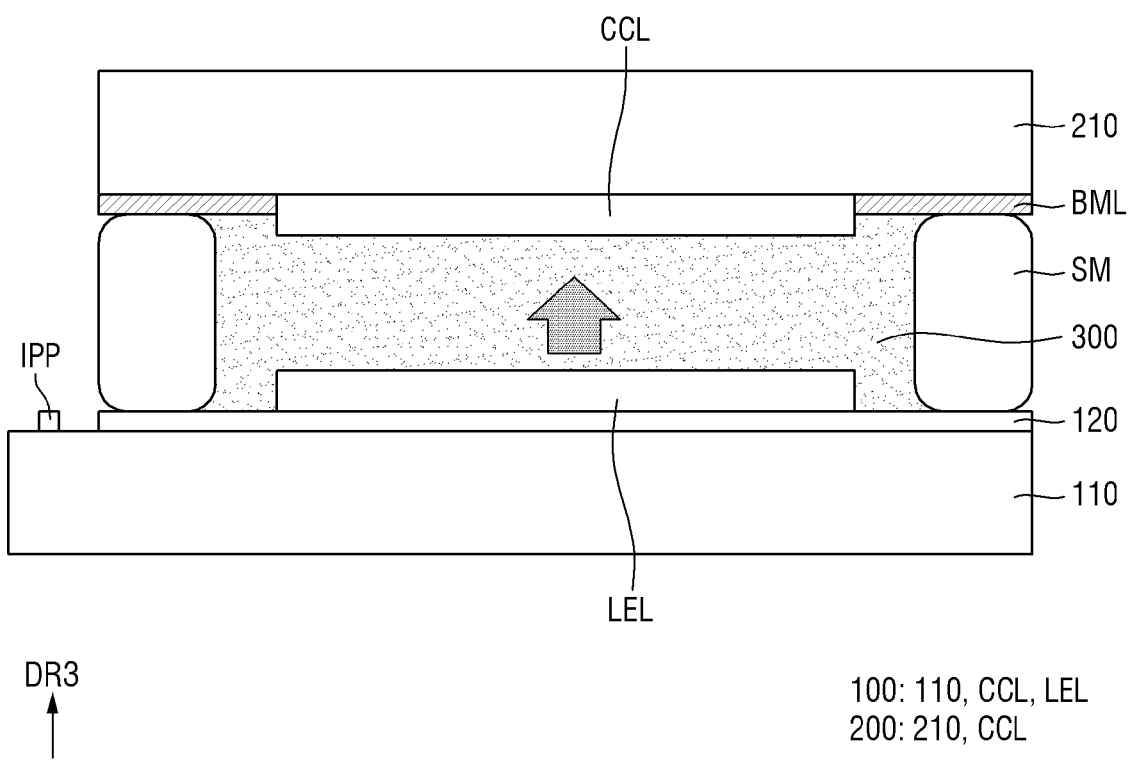

FIGS. 7 to 9 are schematic cross-sectional views illustrating processes of a method for manufacturing a display device according to an embodiment. FIGS. 7 to 9 may correspond to the schematic cross-sectional view of the display device illustrated in FIG. 4.

Referring to FIG. 7, the second substrate 210 may be prepared, and the light blocking member BML and the color conversion layer CCL may be formed on the second substrate 210. The light blocking member BML may be formed by a photolithography method, and the color conversion layer CCL may be formed in areas partitioned by the light blocking member BML. The color conversion layer CCL may be formed by a photolithography or inkjet method. The coupling member SM may be formed on the second substrate 210 on which the light blocking member BML is formed. The coupling member SM may be formed by an inkjet printing method, a dispensing method, a screen printing method, or the like. The coupling member SM may be formed on the light blocking member BML, and may be formed to surround the color conversion layer CCL.

Referring to FIG. 8, the filling member 300 may be formed on a surface of the second substrate 210 on which the light blocking member BML, the color conversion layer CCL, and the coupling member SM are formed. The filling member 300 may be formed by an inkjet printing method, a dispensing method, a screen printing method, or the like. When the filling member 300 is applied, the coupling member SM may serve as a dam to prevent the filling member 300 from overflowing.

Referring to FIG. 9, the first substrate 110 on which the circuit layer 120 and the light emitting element layer LEL are formed may be prepared. The circuit layer 120 may be formed on the first substrate 110 by a photolithography method or the like, and the light emitting element layer LEL may be formed on the circuit layer 120 by photolithography method, an inkjet method, or the like. An inspection pad IPP capable of performing a turn-on inspection or the like may be formed on an edge of the first substrate 110.

The first substrate 110 and the second substrate 210 may be aligned with and bonded to each other. The first substrate 110 and the second substrate 210 may be aligned with and bonded to each other so that the light emitting element layer LEL of the first substrate 110 and the color conversion layer CCL of the second substrate 210 face each other. The filling member 300 may be in contact with the circuit layer 120 and the light emitting element layer LEL formed on the first substrate 110. The coupling member SM may be in contact with the circuit layer 120 formed on the first substrate 110.

A signal may be applied to the circuit layer 120 to drive the light emitting element layer LEL. The entire light emitting element layer LEL may be driven to emit light. In an embodiment, a process of driving the light emitting element layer LEL may be performed simultaneously with an inspection process such as the turn-on inspection of the display device 1. In the inspection process, a signal may be applied by the inspection pad IPP of the first substrate 110 to drive the entire light emitting element layer LEL, thereby emitting light. The light emitting element layer LEL may emit white light from the emission layer. The white light may be irradiated to the filling member 300 disposed on the light emitting element layer LEL to photo-cure the filling member 300. As described above, the filling member 300 may include the photoinitiator capable of being initiated by absorbing the light of the wavelength band of about 380 nm to about 500 nm. Accordingly, the filling member 300 may be initiated and photo-cured by the white light emitted from the light emitting element layer LEL.

The light emitted from the light emitting element layer LEL may be emitted to side portions and an upper portion of the light emitting element layer LEL, and may thus be entirely irradiated to the filling member 300 covering the light emitting element layer LEL. Since the photoinitiator included in the filling member 300 may generate an initiation reaction with only one or two photons, the filling member 300 may be entirely cured without uncured portion.

The light may be irradiated to the coupling member SM to photo-cure the coupling member SM. Even though a portion of uncured filling member 300 may exist because it is far away from the light emitting element layer LEL, it may be photo-cured together with the coupling member SM by the light irradiated to the coupling member SM. As described above, the display device 1 according to an embodiment may be manufactured.

As described above, in the display device 1 according to an embodiment, the filling member 300 including the photoinitiator absorbing the light of the wavelength band of about 380 nm to about 500 nm may be formed, and may be photo-cured with the light emitted from the light emitting element layer LEL in the display device 1. Accordingly, there is no restriction on equipment or a process at the time of curing the filling member 300, and a reliability issue of the light emitting element that may occur at the time of photo-curing the filling member 300 may be prevented.

In the display device 1 illustrated in FIGS. 4 and 5, an embodiment in which the white light is emitted from the light emitting element layer LEL has been described. Hereinafter, embodiments in which blue light is emitted from the light emitting element layer LEL of the display device 1 will be described.

Figure 10:
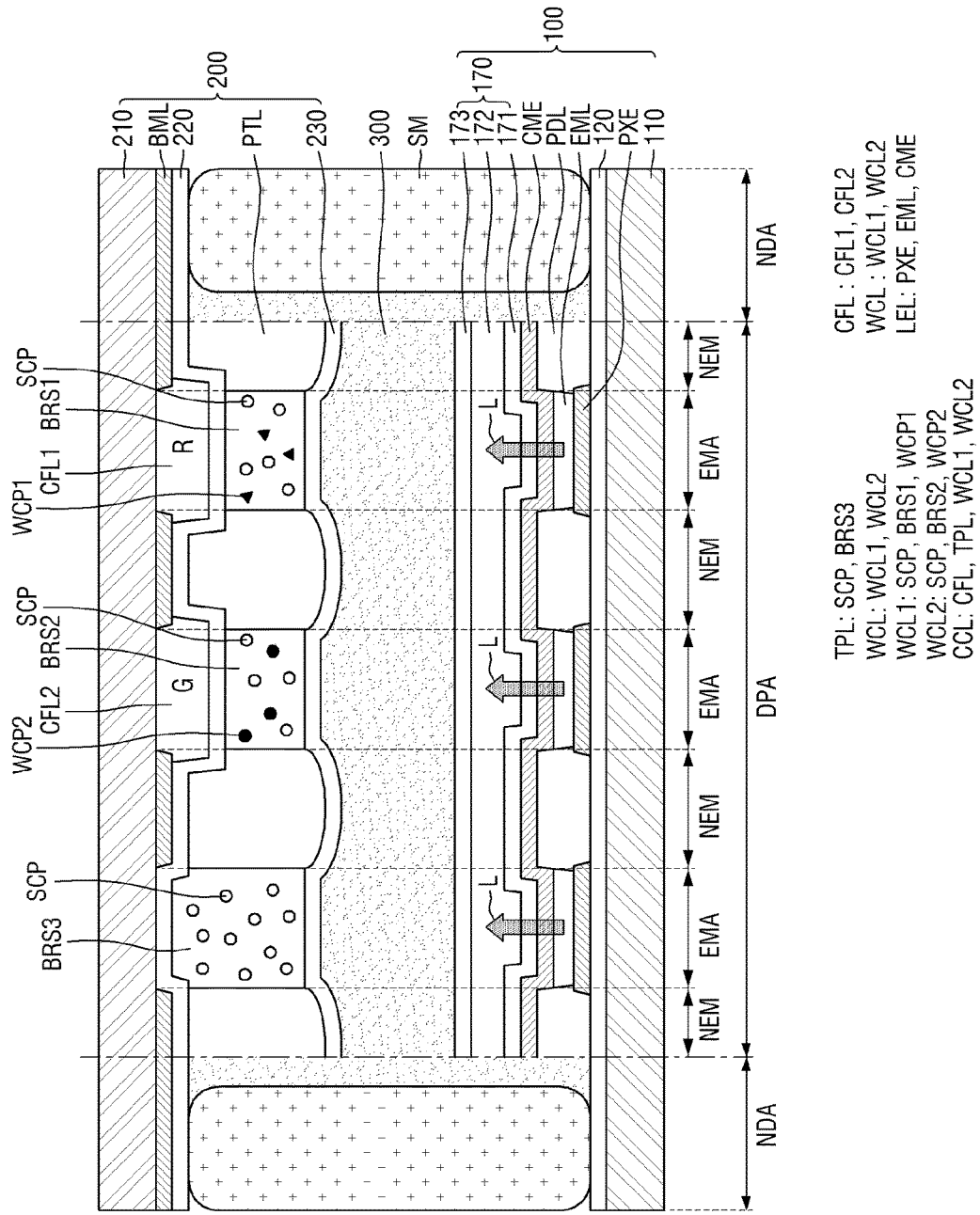
FIG. 10 is a schematic cross-sectional view illustrating a display device according to an embodiment.
Figure 11:
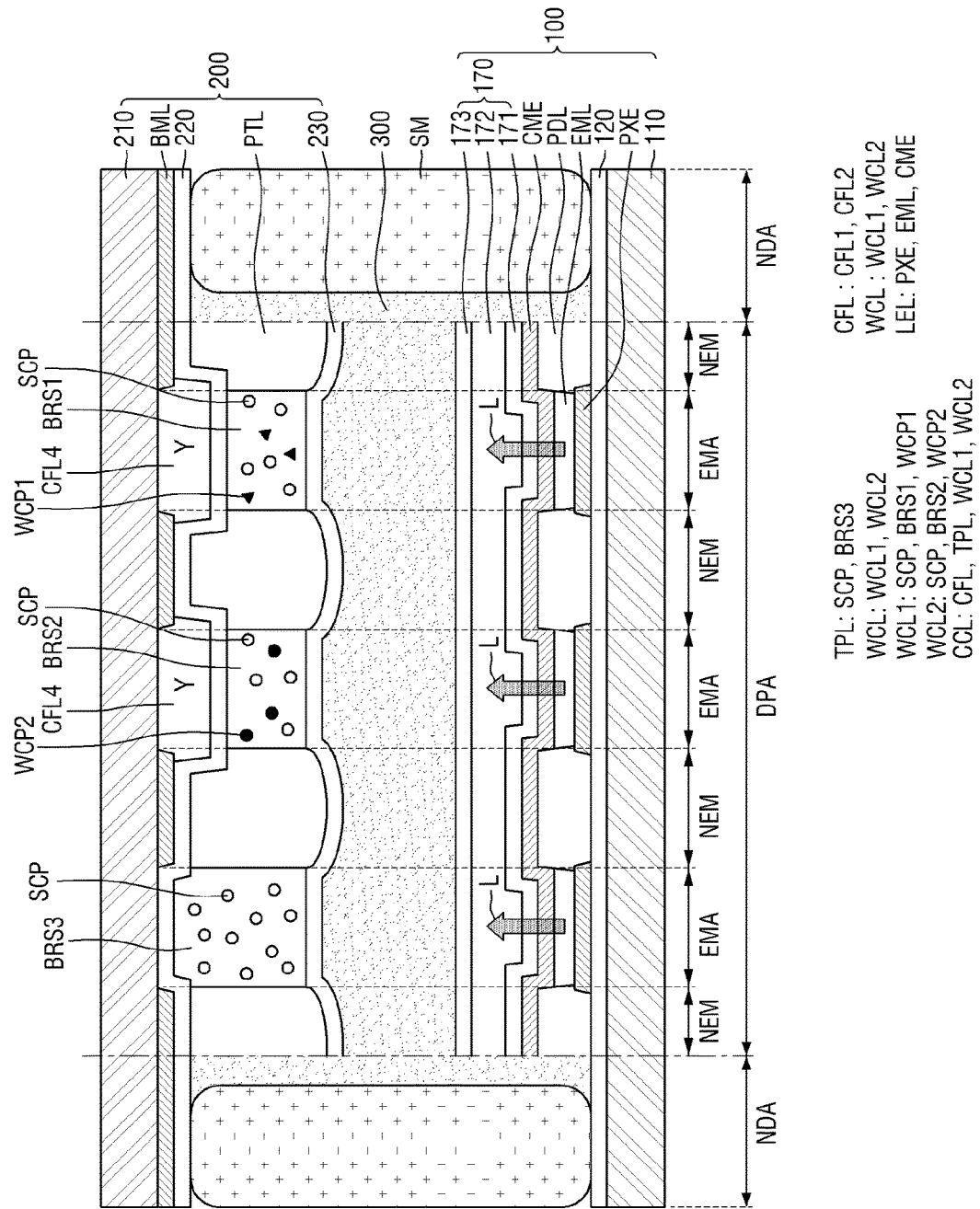
FIG. 11 is a schematic cross-sectional view illustrating a display device according to an embodiment.

FIG. 10 is a schematic cross-sectional view illustrating a display device according to an embodiment. FIG. 11 is a schematic cross-sectional view illustrating a display device according to an embodiment.

Referring to FIG. 10, the embodiment is different from the above-described embodiment in that the light emitting element layer LEL emits blue light and the color conversion layer CCL further includes a light transmitting layer TPL and a wavelength conversion layer WCL. Hereinafter, a description of contents overlapping the above-described embodiment will be omitted, and contents different from the above-described embodiment will be described.

The display device 1 may include a first display substrate 100, a second display substrate 200 facing the first display substrate 100, a filling member 300, and a coupling member SM.

The first display substrate 100 may include a first substrate 110, a circuit layer 120, and a light emitting element layer LEL. The light emitting element layer LEL may include pixel electrodes PXE, emission layers EML, and a common electrode CME.

In an embodiment, a wavelength of light emitted by each emission layer EML may be the same for each sub-pixel. For example, the emission layer EML of each sub-pixel may emit blue light, and a color for each sub-pixel may be displayed through a color conversion layer CCL to be described later.

The second display substrate 200 may include a second substrate 210 and a color conversion layer CCL. The color conversion layer CCL may include a color filter layer CFL, a light transmitting layer TPL, and a wavelength conversion layer WCL.

The color filter layer CFL may be disposed on a surface of the second substrate 210 on which a light blocking member BML is disposed. The color filter layer CFL may include a first color filter layer CFL1 and a second color filter layer CFL2. The first color filter layer CFL1 may be a red color filter layer, and the second color filter layer CFL2 may be a green color filter layer. In FIG. 10, the color filter layer is not disposed in a sub-pixel neighboring to the second color filter layer CFL2, such that the blue light emitted from the light emitting element layer LEL may be transmitted as it is without color conversion. Accordingly, light of three colors such as red, green, and blue may be emitted.

A first capping layer 220 may be disposed on the color filter layer CFL, and a partition wall or bank PTL may be disposed on the first capping layer 220. The bank PTL may be positioned in the non-emission areas NEM. The bank PTL may be disposed to overlap the light blocking member BML. The bank PTL may include openings exposing the color filter layer CFL. The bank PTL may include a photosensitive organic material, but is not limited thereto. The bank PTL may further include a light blocking material.

The wavelength conversion layer WCL and the light transmitting layer TPL may be disposed in spaces exposed by the openings of the bank PTL. The wavelength conversion layer WCL and the light transmitting layer TPL may be formed by an inkjet process using the bank PTL as a bank, but are not limited thereto. In an embodiment, the wavelength conversion layer WCL may include a first wavelength conversion pattern WCL1 overlapping the first color filter layer CFL1 and a second wavelength conversion pattern WCL2 overlapping the second color filter layer CFL2. The light transmitting layer TPL may be disposed in a sub-pixel adjacent to the second wavelength conversion pattern WCL2.

The first wavelength conversion pattern WCL1 may include a first base resin BRS1 and first wavelength conversion materials WCP1 disposed in the first base resin BRS1. The second wavelength conversion pattern WCL2 may include a second base resin BRS2 and second wavelength conversion materials WCP2 disposed in the second base resin BRS2. The light transmitting layer TPL may include a third base resin BRS3 and scatterers SCP disposed in the third base resin BRS3.

The first to third base resins BRS1, BRS2, and BRS3 may include a light transmitting organic material. For example, the first to third base resins BRS1, BRS2, and BRS3 may include an epoxy-based resin, an acrylic resin, a cardo-based resin, an imide-based resin, or the like. All of the first to third base resins BRS1, BRS2, and BRS3 may be made of the same material, but are not limited thereto.

The scatterers SCP may be metal oxide particles or organic particles. Examples of metal oxide of the metal oxide particle may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), or the like, and examples of a material of the organic particle may include an acrylic resin, a urethane resin, or the like.

The first wavelength conversion material WCP1 may be a material converting blue light into red light, and the second wavelength conversion material WCP2 may be a material converting blue light into green light. The first wavelength conversion material WCP1 and the second wavelength conversion material WCP2 may be quantum dots, quantum rods, phosphors, or the like. The quantum dot may include group IV nanocrystals, group II-VI compound nanocrystals, group III-V compound nanocrystals, group IV-VI compound nanocrystals, or combinations thereof. The first wavelength conversion pattern WCL1 and the second wavelength conversion pattern WCL2 may further include scatterers SCP to increase wavelength conversion efficiency.

The light transmitting layer TPL may transmit the blue light emitted from the light emitting element layer LEL as it is. The scatterers SCP of the light transmitting layer TPL may serve to adjust an emission path of the light emitted through the light transmitting layer TPL. The light transmitting layer TPL may not include a wavelength conversion material.

A second capping layer 230 may be disposed on the wavelength conversion layer WCL, the light transmitting layer TPL, and the bank PTL. The second capping layer 230 may be made of an inorganic material. The second capping layer 230 may include a material that may be used for the first capping layer 220 as mentioned above. The second capping layer 230 and the first capping layer 220 may be made of the same material, but are not limited thereto.

In an embodiment, the blue light emitted from the light emitting element layer LEL may be converted into red light in the first wavelength conversion pattern WCL1 and may be emitted as the red light through the first color filter layer CFL1. The blue light emitted from the light emitting element layer LEL may be converted into green light in the second wavelength conversion pattern WCL2 and may be emitted as the green light through the second color filter layer CFL2. The blue light emitted from the light emitting element layer LEL may be emitted through the light transmitting layer TPL as it is. Accordingly, the display device 1 may implement the red light, the green light, and the blue light.

The coupling member SM and the filling member 300 may be disposed between the first display substrate 100 and the second display substrate 200. The filling member 300 according to an embodiment may include a photoinitiator of a visible light wavelength band to be photo-cured with the blue light emitted from the light emitting element layer LEL in the display device 1.

Referring to FIG. 11, a display device 1 according to another embodiment is different from the embodiment of FIG. 10 in that the color conversion layer CCL may include a fourth color filter layer CFL4, which is a yellow color filter layer. The fourth color filter layer CFL4 may prevent the blue light from being mixed with the red light and the green light converted in the first wavelength conversion pattern WCL1 and the second wavelength conversion pattern WCL2.

In an embodiment, the blue light emitted from the light emitting element layer LEL may be converted into the red light in the first wavelength conversion pattern WCL1 and emitted as the red light through the fourth color filter layer CFL4. The blue light emitted from the light emitting element layer LEL may be converted into the green light in the second wavelength conversion pattern WCL2 and emitted as the green light through the fourth color filter layer CFL4. The blue light emitted from the light emitting element layer LEL may be emitted through the light transmitting layer TPL as it is. Accordingly, the display device 1 may implement the red light, the green light, and the blue light.

The light emitting element layer LEL of the display device 1 may emit cyan light.

Figure 12:
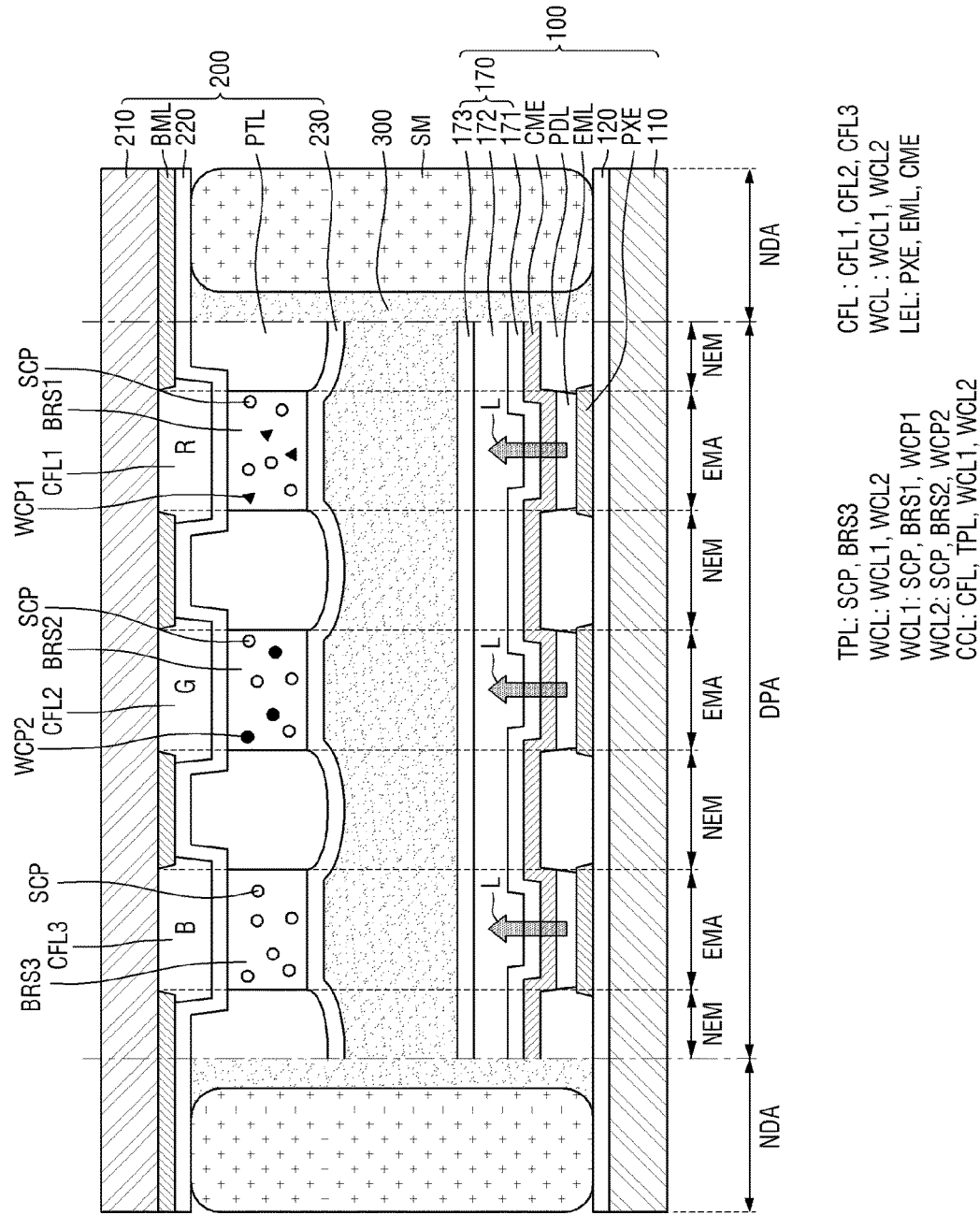
FIG. 12 is a schematic cross-sectional view illustrating a display device according to still an embodiment.
Figure 13:
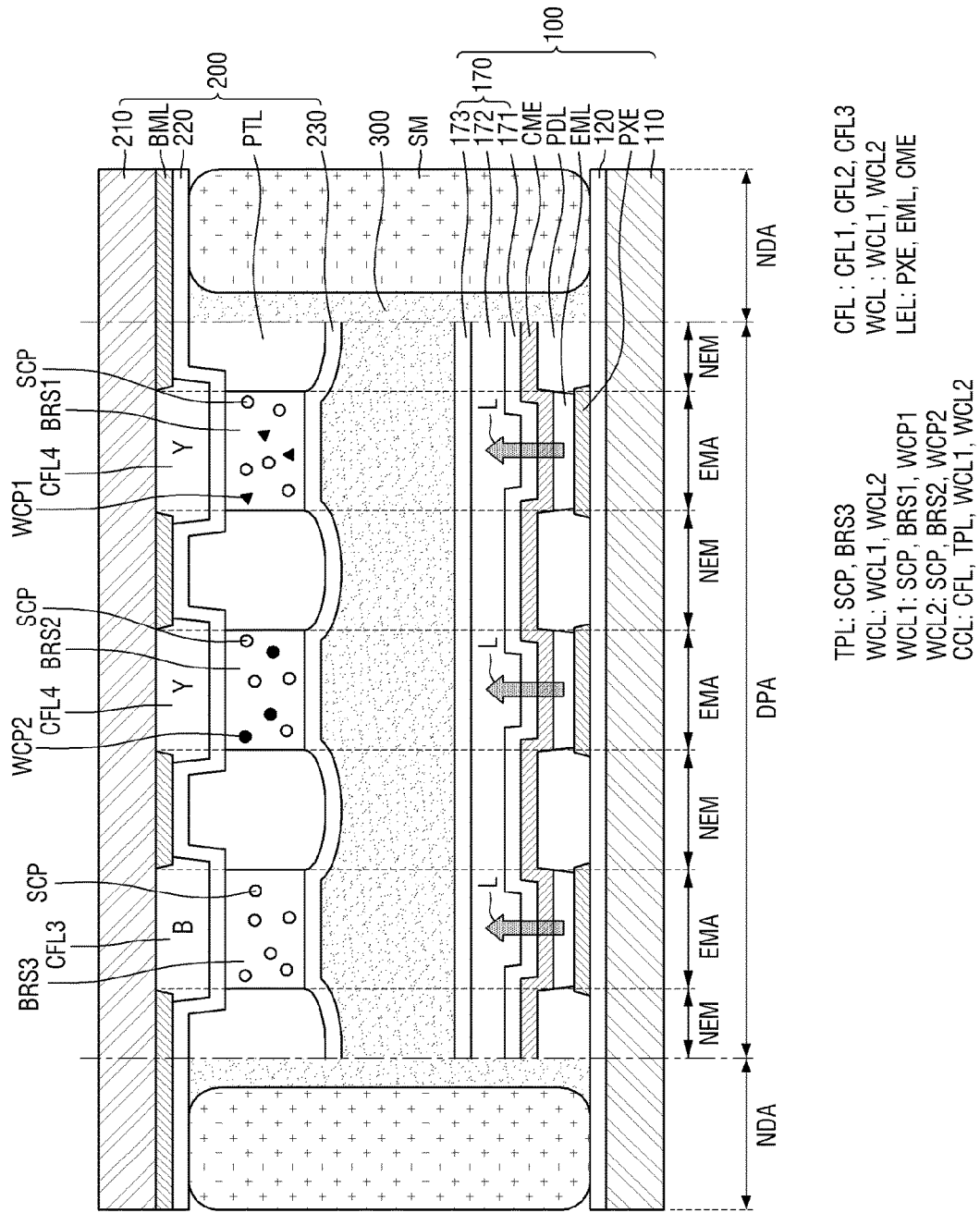
FIG. 13 is a schematic cross-sectional view illustrating a display device according to an embodiment.

FIG. 12 is a schematic cross-sectional view illustrating a display device according to an embodiment. FIG. 13 is a schematic cross-sectional view illustrating a display device according to an embodiment.

Referring to FIG. 12, the embodiment is different from the above-described embodiment of FIGS. 10 and 11 in that the light emitting element layer LEL emits cyan light and the color filter layer CFL of the color conversion layer CCL further includes a third color filter layer CFL3. Hereinafter, a description of contents overlapping the above-described embodiment will be omitted, and contents different from the above-described embodiment will be described.

The display device 1 may include a first display substrate 100, a second display substrate 200 facing the first display substrate 100, a filling member 300, and a coupling member SM.

The first display substrate 100 may include a first substrate 110, a circuit layer 120, and a light emitting element layer LEL. The light emitting element layer LEL may include pixel electrodes PXE, emission layers EML, and a common electrode CME.

In an embodiment, a wavelength of light emitted by each emission layer EML may be the same for each sub-pixel. For example, the emission layer EML of each sub-pixel may emit cyan light, and a color for each sub-pixel may be displayed through a color conversion layer CCL to be described later. The emission layer EML may emit the cyan light by including a blue organic emission layer and a green organic emission layer that are stacked each other.

The second display substrate 200 may include a second substrate 210 and a color conversion layer CCL. The color conversion layer CCL may include a color filter layer CFL, a light transmitting layer TPL, and a wavelength conversion layer WCL.

The color filter layer CFL may be disposed on a surface of the second substrate 210 on which a light blocking member BML is disposed. The color filter layer CFL may include a first color filter layer CFL1, a second color filter layer CFL2, and a third color filter layer CFL3. The first color filter layer CFL1 may be a red color filter layer, the second color filter layer CFL2 may be a green color filter layer, and the third color filter layer CFL3 may be a blue color filter layer.

The wavelength conversion layer WCL and the light transmitting layer TPL may be disposed in spaces exposed by the openings of the bank PTL. The wavelength conversion layer WCL and the light transmitting layer TPL may be formed by an inkjet process using the bank PTL as a bank, but are not limited thereto. In an embodiment, the wavelength conversion layer WCL may include a first wavelength conversion pattern WCL1 overlapping the first color filter layer CFL1, a second wavelength conversion pattern WCL2 overlapping the second color filter layer CFL2, and a light transmitting layer TPL overlapping the third color filter layer CFL3.

In an embodiment, the cyan light emitted from the light emitting element layer LEL may be converted into red light in the first wavelength conversion pattern WCL1 and emitted as the red light through the first color filter layer CFL1. The cyan light emitted from the light emitting element layer LEL may be converted into green light in the second wavelength conversion pattern WCL2 and emitted as the green light through the second color filter layer CFL2. The cyan light emitted from the light emitting element layer LEL may be transmitted through the light transmitting layer TPL as it is, but may be emitted as blue light from the third color filter layer CFL3. Accordingly, the display device 1 may implement the red light, the green light, and the blue light.

Referring to FIG. 13, a display device 1 according to an embodiment is different from the display device according to an embodiment of FIG. 12 in that the color filter layer CLF may include a fourth color filter layer CFL4, which is a yellow color filter layer, instead of the first color filter layer and the second color filter layer. The fourth color filter layer CFL4 may increase color purity of transmitted light.

In an embodiment, the cyan light emitted from the light emitting element layer LEL may be converted into red light in the first wavelength conversion pattern WCL1 and emitted as the red light through the fourth color filter layer CFL4. The cyan light emitted from the light emitting element layer LEL may be converted into green light in the second wavelength conversion pattern WCL2 and emitted as the green light through the fourth color filter layer CFL4. The cyan light emitted from the light emitting element layer LEL may be transmitted through the light transmitting layer TPL, and may be emitted as blue light through the third color filter layer CFL3. Accordingly, the display device 1 may implement the red light, the green light, and the blue light.

In the above-described embodiments, an embodiment in which the light emitting element layer LEL of the display device 1 is an organic light emitting diode has been described. Hereinafter, an embodiment in which the light emitting element layer LEL of the display device 1 is an inorganic light emitting diode will be described.

Figure 14:
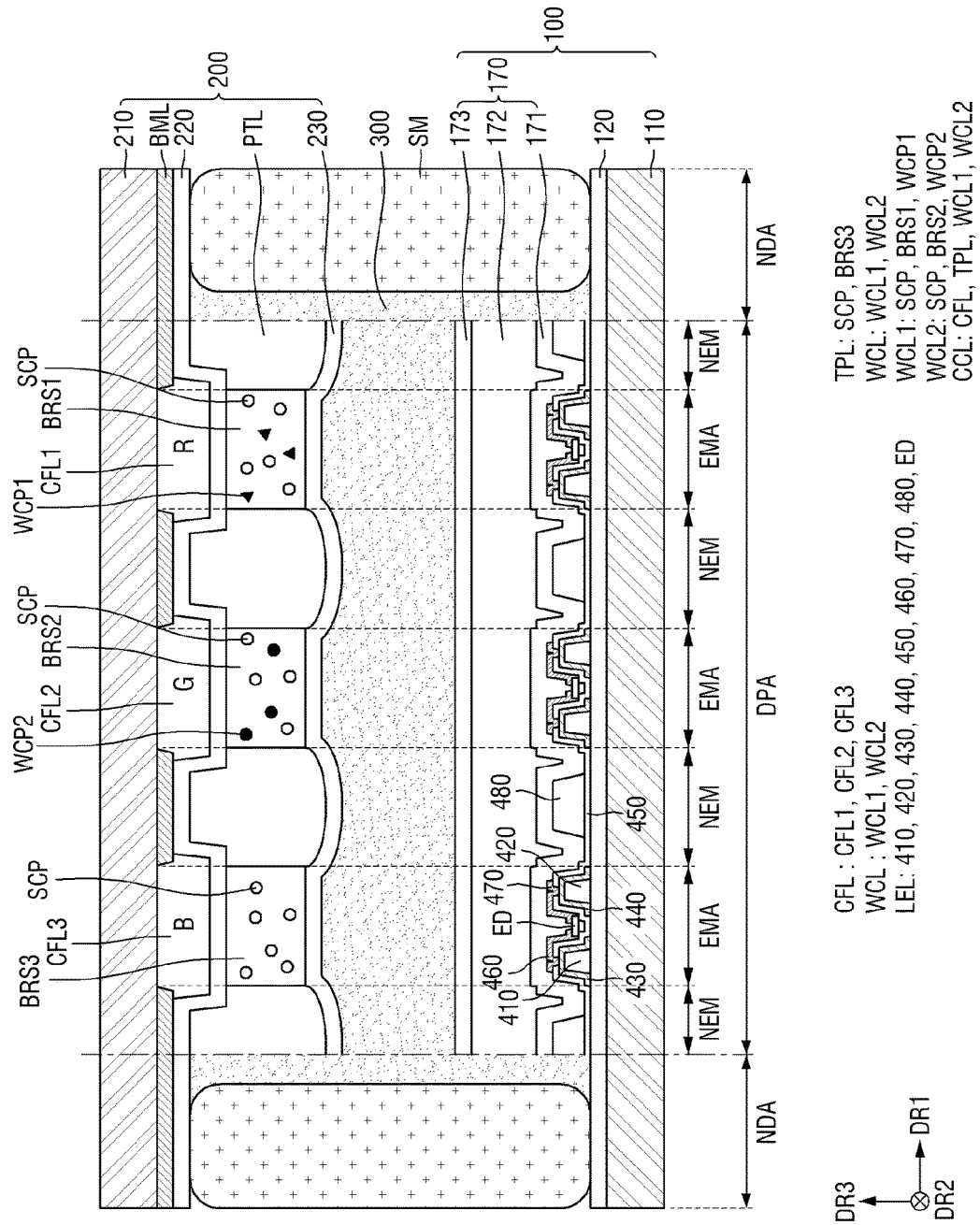
FIG. 14 is a schematic cross-sectional view illustrating a display device according to an embodiment.
Figure 15:
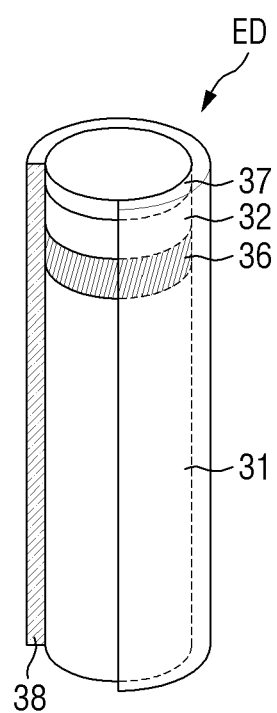
FIG. 15 is a schematic perspective view illustrating a light emitting element of a display device according to an embodiment.

FIG. 14 is a schematic cross-sectional view illustrating a display device according to an embodiment. FIG. 15 is a schematic perspective view illustrating a light emitting element of a display device according to an embodiment.

Referring to FIGS. 14 and 15, the embodiment is different from the above-described embodiments in that the light emitting element layer LEL is an inorganic light emitting diode. Hereinafter, a description of contents overlapping the above-described embodiments will be omitted, and contents different from the above-described embodiments will be described.

In a display device 1 according to an embodiment, the light emitting element layer LEL may include an inorganic light emitting diode. The light emitting element layer LEL may include multiple sub-banks 410 and 420, multiple electrodes 430 and 440, multiple light emitting elements ED, banks 480, a first insulating layer 450, and multiple connection electrodes 460 and 470 that are disposed on the circuit layer 120.

The multiple sub-banks 410 and 420 may be disposed on the circuit layer 120. The multiple sub-banks 410 and 420 may include a first sub-bank 410 and a second sub-bank 420 disposed to be spaced apart from each other. The first sub-bank 410 and the second sub-bank 420 may have a shape extending in the second direction DR2. The multiple light emitting elements ED may be disposed between the first sub-bank 410 and the second sub-bank 420. The multiple light emitting elements ED may be disposed in the multiple sub-pixels.

The multiple sub-banks 410 and 420 may have a structure in which at least portions thereof protrude from an upper surface of the circuit layer 120. The protruding portions of the multiple sub-banks 410 and 420 may have inclined side surfaces, and light emitted from the light emitting elements ED may be reflected from the electrodes 430 and 440 disposed on the multiple sub-banks 410 and 420 and be emitted in an upward direction. However, the disclosure is not limited thereto, and the multiple sub-banks 410 and 420 may have a semi-circular or semi-elliptical shape with curved outer surfaces. The multiple sub-banks 410 and 420 may include an organic insulating material such as polyimide (PI), but are not limited thereto.

The multiple electrodes 430 and 440 may extend in the second direction DR2, may be disposed in each sub-pixel, and may be disposed to be spaced apart from each other in the first direction DR1. The multiple electrodes 430 and 440 may be electrically connected to the light emitting elements ED. The multiple electrodes 430 and 440 may be electrically connected to the light emitting elements ED through connection electrodes 460 and 470 to be described later, and may transfer electrical signals applied from the circuit layer 120 disposed therebelow to the light emitting elements ED.

The multiple electrodes 430 and 440 may include a first electrode 430 and a second electrode 440. The first electrode 430 may be disposed on the first sub-bank 410, and the second electrode 440 may be disposed on the second sub-bank 420. The first electrode 430 and the second electrode 440 may be disposed on at least the inclined side surfaces of the sub-banks 410 and 420, respectively. In an embodiment, a width of each of the multiple electrodes 430 and 440 measured in the first direction DR1 may be greater than a width of each of the sub-banks 410 and 420 measured in the first direction DR1. The first electrode 430 and the second electrode 440 may be disposed to cover at least one side surface of the sub-banks 410 and 420 to reflect the light emitted from the light emitting elements ED. The light emitted from the light emitting elements ED may be reflected by the electrodes 430 and 440 disposed on the sub-banks 410 and 420 and be emitted in the upward direction.

Each of the electrodes 430 and 440 may include a conductive material having high reflectivity to reflect light emitted from the light emitting elements ED. Each of the electrodes 430 and 440 may include a material having high reflectivity and high conductivity. For example, each of the electrodes 430 and 440 may include aluminum (Al) or an alloy material including aluminum (Al), nickel (Ni), lanthanum (La), copper (Cu), or the like. Each of the electrodes 430 and 440 may further include materials such as ITO, IZO, and ITZO, or have a structure in which one or more layers made of these materials are stacked each other.

The respective electrodes 430 and 440 may be electrically connected to the light emitting elements ED through connection electrodes 460 and 470 to be described later, and the respective electrodes 430 and 440 may be in contact (e. g., directly contact) with the connection electrodes 460 and 470, respectively. Although not illustrated in FIG. 14, the first electrode 430 and the second electrode 440 may be electrically connected to the circuit layer 120 through contact holes. For example, a first source voltage may be applied to the first electrode 430, and a second source voltage may be applied to the second electrode 440.

The first insulating layer 450 may be disposed on the multiple electrodes 430 and 440. The first insulating layer 450 may expose at least a portion of each of the electrodes 430 and 440. The exposed electrodes 430 and 440 may be electrically connected to connection electrodes 460 and 470 to be described later, respectively. The first insulating layer 450 may be made of an inorganic material.

The banks 480 may be disposed on the first insulating layer 450. The banks 480 may include portions extending in the first direction DR1 and the second direction DR2 to surround each sub-pixel. The banks 480 may be disposed to overlap the non-emission areas NEM. The banks 480 may prevent ink from overflowing into the surrounding emission area in case that light emitting elements ED to be described later are applied by an inkjet method.

The multiple light emitting elements ED may be disposed on the first insulating layer 450. The light emitting element ED may have a shape that extends in a direction, and may be disposed so that the direction the light emitting element ED extends may be parallel to the first substrate 110. The light emitting element ED may include multiple semiconductor layers disposed along a direction in which it extends, and the multiple semiconductor layers may be sequentially disposed along a direction parallel to an upper surface of the first substrate 110. However, the disclosure is not limited thereto, and in case that the light emitting element ED has another structure, the multiple semiconductor layers may also be disposed in a direction perpendicular to the first substrate 110.

The multiple light emitting elements ED may be disposed on the electrodes 430 and 440 that are spaced apart from each other in the first direction DR1 between the sub-banks 410 and 420. The light emitting elements ED may be disposed so that at least one ends thereof are put on any one of the electrodes 430 and 440 or both ends thereof are put on the electrodes 430 and 440, respectively. The light emitting elements ED may be disposed so that both ends thereof are put on the electrodes 430 and 440, respectively. A direction in which the respective electrodes 430 and 440 extend and a direction in which the light emitting elements ED extend may be substantially perpendicular to each other. The light emitting elements ED may be disposed to be spaced apart from each other along the second direction DR2 in which the respective electrodes 430 and 440 extend, and may be aligned to be substantially parallel to each other. However, the disclosure is not limited thereto, and the light emitting elements ED may also be disposed to be oblique to the direction in which the respective electrodes 430 and 440 extend.

The light emitting elements ED may include semiconductor layers made of the same material to emit light of the same wavelength band. For example, the light emitting elements ED may emit blue light. The light emitting elements ED may be in contact with the connection electrodes 460 and 470 to emit light of a specific wavelength band by electrical signals applied through the electrodes 430 and 440.

As illustrated in FIG. 15, the light emitting element ED may be a light emitting diode. Specifically, the light emitting element ED may be an inorganic light emitting diode having a size of a nanometer to a micrometer scale and made of an inorganic material. The light emitting element ED may be aligned between two electrodes in which polarities are formed in case that an electric field is formed in a specific direction between the two electrodes facing each other.

The light emitting element ED according to an embodiment may have a shape that extends in a direction. The light emitting element ED may have a shape such as a cylindrical shape, a rod shape, a wire shape, or a tube shape. However, the light emitting element ED is not limited to the shape described above, and may have various shapes. For example, the light emitting element ED may have a polygonal prismatic shape such as a cubic shape, a rectangular parallelepiped shape, or a hexagonal prismatic shape or have a shape that extends in a direction and has a partially inclined outer surface.

The light emitting element ED may include a semiconductor layer doped with any conductivity-type (e.g., p-type or n-type) impurities. The semiconductor layer may receive an electrical signal applied from an external power source to emit light of a specific wavelength band. The light emitting element ED may include a first semiconductor layer 31, a second semiconductor layer 32, a light emitting layer 36, an electrode layer 37, and an insulating film 38.

The first semiconductor layer 31 may be an n-type semiconductor. The first semiconductor layer 31 may include a semiconductor material having a chemical formula of $Al_xGa_yIn_{1-x-y}N$ ($0 \leq x \leq 1$, $0 \leq y \leq 1$, and $0 \leq x+y \leq 1$). For example, the semiconductor material of the first semiconductor layer 31 may be one or more of AlGaInN, GaN, AlGaN, InGaN, AlN, or InN doped with an n-type dopant. The n-type dopant doped in the first semiconductor layer 31 may be Si, Ge, Sn, or the like.

The second semiconductor layer 32 may be disposed on the first semiconductor layer 31 with the light emitting layer 36 interposed therebetween. The second semiconductor layer 32 may be a p-type semiconductor, and may include a semiconductor material having a chemical formula of $Al_xGa_yIn_{1-x-y}N$ ($0 \leq x \leq 1$, $0 \leq y \leq 1$, and $0 \leq x+y \leq 1$). For example, the semiconductor material of the second semiconductor layer 32 may be one or more of AlGaInN, GaN, AlGaN, InGaN, AlN, or InN doped with a p-type dopant. The p-type dopant doped in the second semiconductor layer 32 may be Mg, Zn, Ca, Sr, Ba, or the like.

It has been illustrated in FIG. 15 that each of the first semiconductor layer 31 and the second semiconductor layer 32 is configured as one layer, but the disclosure is not limited thereto. Each of the first semiconductor layer 31 and the second semiconductor layer 32 may further include multiple layers, for example, a clad layer or a tensile strain barrier reducing (TSBR) layer, depending on a material of the light emitting layer 36.

The light emitting layer 36 may be disposed between the first semiconductor layer 31 and the second semiconductor layer 32. The light emitting layer 36 may include a material having a single or multiple quantum well structure. In case that the light emitting layer 36 includes the material having the multiple quantum well structure, the light emitting layer 36 may have a structure in which multiple quantum layers and well layers are alternately stacked each other. The light emitting layer 36 may emit light by a combination of electron-hole pairs in response to electrical signals applied through the first semiconductor layer 31 and the second semiconductor layer 32. The light emitting layer 36 may include a material such as AlGaN or AlGaInN. In particular, in case that the light emitting layer 36 has the multiple quantum well structure that is the structure in which the quantum layers and the well layers are alternately stacked each other, the quantum layers may include a material such as AlGaN or AlGaInN, and the well layers may include a material such as GaN or AlInN.

The light emitting layer 36 may have a structure in which semiconductor materials having large band gap energy and semiconductor materials having small band gap energy are alternately stacked each other, and may include Group III to Group V semiconductor materials according to a wavelength band of emitted light. The light emitted by the light emitting layer 36 is not limited to the light of the blue wavelength band, and in some cases, the light emitting layer 36 may emit light of red or green wavelength bands.

The electrode layer 37 may be an ohmic connection electrode. However, the disclosure is not limited thereto, and the electrode layer 37 may be a Schottky connection electrode. The light emitting element ED may include at least one electrode layer 37. The light emitting element ED may include one or more electrode layers 37, but the disclosure is not limited thereto, and the electrode layers 37 may also be omitted.

The electrode layer 37 may decrease resistance between the light emitting element ED and the electrode or the connection electrode in case that the light emitting element ED is electrically connected to the electrode or the connection electrode in the display device 1. The electrode layer 37 may include a metal having conductivity. The electrode layer 37 may include at least one of aluminum (Al), titanium (Ti), indium (In), gold (Au), silver (Ag), ITO, IZO, and ITZO.

The insulating film 38 may be disposed to surround outer surfaces of the multiple semiconductor layers and the electrode layer described above. For example, the insulating film 38 may be disposed to surround at least an outer surface of the light emitting layer 36, and may be formed to expose both ends of the light emitting element ED in a length direction. The insulating film 38 may also be formed so that an upper surface thereof is rounded in a cross-sectional view in an area adjacent to at least one end of the light emitting element ED.

The insulating film 38 may include materials having insulating properties, such as silicon oxide ($SiO_x$), silicon nitride ($SiN_x$), silicon oxynitride ($SiO_xN_y$), aluminum nitride ($AlN_x$), or aluminum oxide ($AlO_x$). It has been illustrated in FIG. 15 that the insulating film 38 is formed as a single layer, but the disclosure is not limited thereto, and in embodiments, the insulating film 38 may also be formed in a multilayer structure in which multiple layers are stacked each other.

The insulating film 38 may serve to protect these members. The insulating film 38 may prevent an electrical short circuit that may occur in the light emitting layer 36 in case that the light emitting layer 36 is in contact (e. g., directly contact) with an electrode through which an electrical signal is transferred to the light emitting element ED. The insulating film 38 may prevent a decrease in luminous efficiency of the light emitting element ED.

An outer surface of the insulating film 38 may be surface-treated. The light emitting elements ED may be jetted onto electrodes in a state in which they are dispersed in ink and may be aligned. In order to maintain the light emitting elements ED in a state in which the light emitting elements ED are dispersed without being agglomerated with other adjacent light emitting elements ED in the ink, a hydrophobic or hydrophilic treatment may be performed on a surface of the insulating film 38.

The multiple connection electrodes 460 and 470 may be disposed on and in contact with the multiple electrodes 430 and 440 and the light emitting elements ED, respectively. The connection electrodes 460 and 470 may be in contact with any one ends of the light emitting elements ED and at least one of the electrodes 430 and 440.

The multiple connection electrodes 460 and 470 may include a first connection electrode 460 and a second connection electrode 470. The first connection electrode 460 may have a shape that extends in the second direction DR2, and may be disposed on the first electrode 430. A portion of the first connection electrode 460 disposed on the first sub-bank 410 may overlap the first electrode 430, and may extend from the first electrode 430 in the second direction DR2. The first connection electrode 460 may be electrically connected to the first electrode 430 and may be in contact with an ends of the light emitting elements ED to transfer the electrical signals applied from the circuit layer 120 to the light emitting elements ED.

The second connection electrode 470 may have a shape that extends in the second direction DR2, and may be disposed on the second electrode 440. A portion of the second connection electrode 470 disposed on the second sub-bank 420 may overlap the second electrode 440, and may extend from the second electrode 440 in the second direction DR2. The second connection electrode 470 may be electrically connected to the second electrode 440 and may be in contact with another ends of the light emitting elements ED to transfer electrical signals applied from power lines to the light emitting elements ED.

The display device 1 according to an embodiment may include the light emitting element layer LEL including the inorganic light emitting diode, and the filling member 300 may be photo-cured with the blue light emitted from the light emitting element layer LEL. Accordingly, there is no restriction on equipment or a process at the time of curing the filling member 300, and a reliability issue of the light emitting element that may occur at the time of photo-curing the filling member 300 may be prevented.

In concluding the detailed description, those skilled in the art will appreciate that many variations and modifications may be made to the embodiments without substantially departing from the principles of the disclosure. Therefore, the disclosed embodiments of the disclosure are to be used in a generic and descriptive sense only and not for purposes of limitation.

What is claimed is:

1. A display device comprising:
   a first display substrate including a light emitting element layer;
   a second display substrate facing the first display substrate, the second display substrate including a light blocking member and a color conversion layer;
   a coupling member that connects the first display substrate and the second display substrate to each other and contacting the first display substrate and the second display substrate; and
   a filling member disposed between the first display substrate and the second display substrate, wherein
   the filling member includes a photoinitiator that initiates by absorbing light of a wavelength band in a range of about 380 nm to about 500 nm, and
   the light blocking member and the color conversion layer cover a side of an entire surface of the second display substrate.

2. The display device of claim 1, wherein the filling member further includes an acrylate-based monomer and a crosslinking agent.

3. The display device of claim 2, wherein the photoinitiator includes at least one selected from the group of diphenyl-(2,4,6-trimethylbenzoyl)-phosphine oxide (TPO), bis-(4-methoxybenzoyl) diethyl germanium, camphorquinone (CQ), and 1-phenyl-1,2-propanedione (PPD).

4. The display device of claim 1, wherein the filling member has a refractive index in a range of about 1.5 to about 1.7.

5. The display device of claim 1, wherein the light emitting element layer emits light of a wavelength band in a range of about 380 nm to about 500 nm.

6. The display device of claim 5, wherein
   the light emitting element layer emits white light, and
   the color conversion layer includes a color filter layer including a first color filter layer transmitting red light, a second color filter layer transmitting green light, and a third color filter layer transmitting blue light.

7. The display device of claim 5, wherein
   the color conversion layer includes a wavelength conversion layer, a light transmitting layer, and a color filter layer,
   the wavelength conversion layer includes:
      a first wavelength conversion pattern converting blue light emitted from the light emitting element layer into red light; and
      a second wavelength conversion pattern converting the blue light emitted from the light emitting element layer into green light,
   the color filter layer includes:
      a first color filter layer overlapping the first wavelength conversion pattern in a plan view and transmitting the red light; and
      a second color filter layer overlapping the second wavelength conversion pattern in a plan view and transmitting the green light,
   the light transmitting layer does not overlap the wavelength conversion layer and the color filter layer, and
   the light transmitting layer transmits the blue light emitted from the light emitting element layer.

8. The display device of claim 5, wherein
   the color conversion layer includes a wavelength conversion layer, a light transmitting layer, and a color filter layer,
   the wavelength conversion layer includes:
      a first wavelength conversion pattern converting blue light emitted from the light emitting element layer into red light; and a second wavelength conversion pattern converting the blue light emitted from the light emitting element layer into green light, the color filter layer includes:
- a first fourth color filter layer overlapping the first wavelength conversion pattern in a plan view and transmitting the red light; and
- a second fourth color filter layer overlapping the second wavelength conversion pattern in a plan view and transmitting the green light, the light transmitting layer does not overlap the wavelength conversion layer and the color filter layer, and the light transmitting layer transmits the blue light emitted from the light emitting element layer.

9. The display device of claim 5, wherein the color conversion layer includes a wavelength conversion layer, a light transmitting layer, and a color filter layer, the wavelength conversion layer includes:
- a first wavelength conversion pattern converting cyan light emitted from the light emitting element layer into red light; and
- a second wavelength conversion pattern converting the cyan light emitted from the light emitting element layer into green light, the color filter layer includes:
- a first color filter layer overlapping the first wavelength conversion pattern in a plan view and transmitting the red light;
- a second color filter layer overlapping the second wavelength conversion pattern in a plan view and transmitting the green light; and
- a third color filter layer transmitting blue light from the cyan light emitted from the light emitting element layer, the light transmitting layer is disposed below the third color filter layer, and the light transmitting layer transmits the cyan light emitted from the light emitting element layer.

10. The display device of claim 5, wherein the color conversion layer includes a wavelength conversion layer, a light transmitting layer, and a color filter layer, the wavelength conversion layer includes:
- a first wavelength conversion pattern converting cyan light emitted from the light emitting element layer into red light; and
- a second wavelength conversion pattern converting the cyan light emitted from the light emitting element layer into green light, the color filter layer includes:
- a first fourth color filter layer overlapping the first wavelength conversion pattern in a plan view and transmitting the red light; and
- a second fourth color filter layer overlapping the second wavelength conversion pattern in a plan view and transmitting the green light, the light transmitting layer does not overlap the wavelength conversion layer and the color filter layer in a plan view, and the light transmitting layer transmits the cyan light emitted from the light emitting element layer.

11. The display device of claim 2, wherein the light emitting element layer includes an organic light emitting diode or an inorganic light emitting diode.

12. A method for manufacturing a display device, comprising:

preparing a first display substrate including a light emitting element layer;

preparing a second display substrate including a light blocking member and a color conversion layer;

disposing a coupling member and a filling member composition on the second display substrate;

bonding the first display substrate and the second display substrate to each other; and turning on the light emitting element layer and curing the filling member composition using light emitted from the light emitting element layer to form a filling member.

13. The method for manufacturing a display device of claim 12, wherein the filling member composition includes an acrylate-based monomer, a crosslinking agent, and a photoinitiator that initiates by absorbing light of a wavelength band in a range of about 380 nm to about 500 nm.

14. The method for manufacturing a display device of claim 13, wherein the photoinitiator includes at least one selected from the group of diphenyl-(2,4,6-trimethylbenzoyl)-phosphine oxide (TPO), bis-(4-methoxybenzoyl) diethyl germanium, camphorquinone (CQ), and 1-phenyl-1, 2-propanedione (PPD).

15. The method for manufacturing a display device of claim 13, wherein an amount of the acrylate-based monomer is in a range of about 98 wt % to about 99.8 wt % based on a total weight of the filling member composition, an amount of the crosslinking agent is in a range of about 0.1 wt % to about 1 wt % based on a total weight of the filling member composition, and an amount of the photoinitiator is in a range of about 0.1 wt % to about 1 wt % based on a total weight of the filling member composition.

16. The method for manufacturing a display device of claim 13, wherein the filling member composition has a viscosity in a range of about 1 cp to about 10 cp.

17. The method for manufacturing a display device of claim 12, wherein the filling member has a refractive index in a range of about 1.5 to about 1.7.

18. The method for manufacturing a display device of claim 12, wherein the light emitting element layer emits light of a single color of a wavelength band in a range of about 380 nm to about 500 nm.

19. The method for manufacturing a display device of claim 18, wherein the light emitting element layer emits any one of white light, blue light, and cyan light.

20. The method for manufacturing a display device of claim 12, further comprising:

curing the coupling member by irradiating a separate light to the coupling member.

* * * * *